US010742918B2

(12) United States Patent
Osawa

(10) Patent No.: US 10,742,918 B2
(45) Date of Patent: Aug. 11, 2020

(54) AD CONVERTER AND IMAGE SENSOR

(71) Applicant: OLYMPUS CORPORATION, Hachioji-shi, Tokyo (JP)

(72) Inventor: Masato Osawa, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 72 days.

(21) Appl. No.: 16/126,092

(22) Filed: Sep. 10, 2018

(65) Prior Publication Data
US 2019/0020841 A1 Jan. 17, 2019

Related U.S. Application Data

(63) Continuation of application No. PCT/JP2016/057956, filed on Mar. 14, 2016.

(51) Int. Cl.
H04N 5/3745 (2011.01)
H04N 5/378 (2011.01)
(Continued)

(52) U.S. Cl.
CPC ........ *H04N 5/37455* (2013.01); *H03M 1/182* (2013.01); *H03M 1/466* (2013.01);
(Continued)

(58) Field of Classification Search
CPC ...... H03M 1/123; H03M 1/182; H03M 1/466; H03M 1/468; H04N 5/37455; H04N 5/378
See application file for complete search history.

(56) References Cited

U.S. PATENT DOCUMENTS 7,068,319 B2 * 6/2006 Barna ................ H04N 5/23241
250/208.1
2005/0200510 A1 * 9/2005 Yoshida .............. H03M 1/1245
341/155
(Continued)

FOREIGN PATENT DOCUMENTS

JP 2005-223888 A 8/2005
JP 2007-142863 A 6/2007
(Continued)

OTHER PUBLICATIONS

International Search Report dated Jun. 7, 2016, issued in counterpart application No. PCT/JP2016/057956, w/English translation. (2 pages).
(Continued)

Primary Examiner — Amy R Hsu
(74) Attorney, Agent, or Firm — Westerman, Hattori, Daniels & Adrian, LLP

(57) ABSTRACT

An AD converter includes a first DAC circuit, a second DAC circuit, a comparison circuit, a control circuit, and a control switch. The comparison circuit is connected to a first output node of the first DAC circuit and a second output node of the second DAC circuit and compares an electric potential of the first output node with an electric potential of the second output node. The control circuit controls the first DAC circuit and the second DAC circuit in accordance with a result of the comparison acquired by the comparison circuit. The control switch controls turning on and off of connection between a first input node of the first DAC circuit and a second input node of the second DAC circuit.

6 Claims, 10 Drawing Sheets

(51) Int. Cl.
*H03M 1/18* (2006.01)
*H03M 1/46* (2006.01)
*H03M 1/12* (2006.01)

(52) U.S. Cl.
CPC ............ *H04N 5/378* (2013.01); *H03M 1/123* (2013.01); *H03M 1/468* (2013.01)

(56) References Cited

U.S. PATENT DOCUMENTS

| | | | | |
|---|---|---|---|---|
| 2008/0129573 A1* | 6/2008 | Mueck | ................ | H03M 1/0682 341/163 |
| 2011/0176042 A1* | 7/2011 | Kato | ................ | H01L 27/14641 348/294 |
| 2012/0262316 A1* | 10/2012 | Strode | ................ | H03M 1/162 341/110 |
| 2015/0162933 A1* | 6/2015 | Girardi | ................ | H03M 1/001 341/145 |
| 2015/0249463 A1* | 9/2015 | Alladi | ................ | H03M 1/1245 341/150 |
| 2015/0256779 A1* | 9/2015 | Haraguchi | ............. | H04N 5/378 348/308 |
| 2016/0006969 A1* | 1/2016 | Matsumoto | .......... | H04N 5/3692 348/308 |
| 2016/0204789 A1* | 7/2016 | Vyas | ................... | H03M 1/1225 341/161 |

FOREIGN PATENT DOCUMENTS

| | | |
|---|---|---|
| JP | 2011-188240 A | 9/2011 |
| JP | 2014-22763 A | 2/2014 |
| WO | 2009/131018 A1 | 10/2009 |
| WO | 2014/024922 A1 | 2/2014 |

OTHER PUBLICATIONS

Office Action dated Dec. 24, 2019, issued in counterpart JP application No. 2018-505066, with English translation. (6 pages).

* cited by examiner

AD CONVERTER AND IMAGE SENSOR

The present application is a continuation application based on International Patent Application No. PCT/JP 2016/057956 filed on Mar. 14, 2016, the content of which is incorporated herein by reference.

BACKGROUND OF THE INVENTION

Field of the Invention

The present invention relates to an analog-to digital (AD) converter and an image sensor.

Description of Related Art

A CMOS image sensor according to a conventional technology including a full-differential type AD converter is disclosed in U.S. Pat. No. 7,068,319. The CMOS image sensor includes a pixel array, a column signal holding circuit, a multiplexer, a gain block, an ADC, and the like. The gain block converts a single end signal held in the column signal holding circuit into a full-differential signal and amplifies a signal output from the pixel array. The gain block drives a sampling capacitor of the full-differential type AD converter.

SUMMARY OF THE INVENTION

According to a first aspect of the present invention, an AD converter includes a first DAC circuit, a second DAC circuit, a comparison circuit, a control circuit, and a control switch. The first DAC circuit includes a plurality of first capacitors of which capacitance values are weighted. The second DAC circuit includes a plurality of second capacitors of which capacitance values are weighted. The comparison circuit is connected to a first output node of the first DAC circuit and a second output node of the second DAC circuit and compares an electric potential of the first output node with an electric potential of the second output node. The control circuit controls the first DAC circuit and the second DAC circuit in accordance with a result of the comparison acquired by the comparison circuit. The control switch controls turning on and off of connection between a first input node of the first DAC circuit and a second input node of the second DAC circuit.

According to a second aspect of the present invention, in the first aspect, at least one of the comparison circuit and the control circuit may include at least one first transistor. At least one of the first DAC circuit and the second DAC circuit may include at least one second transistor. A breakdown voltage of the first transistor may be lower than a breakdown voltage of the second transistor. The AD converter may further include a clipping circuit. The clipping circuit may be connected to at least one of the first input node and the second input node and control voltages input to the first DAC circuit and the second DAC circuit such that the voltages are within a range of a rated voltage of the first transistor.

According to a third aspect of the present invention, in the first aspect, a video signal generating circuit may be connected to one of the first input node of the first DAC circuit and the second input node of the second DAC circuit. The video signal generating circuit generates a video signal. An offset signal generating circuit may be connected to a node other than the node to which the video signal generating circuit is connected out of the first input node and the second input node. The offset signal generating circuit generates an offset signal. The AD converter may further include a reference electric potential generating circuit. The reference electric potential generating circuit may detect a middle electric potential and output the detected middle electric potential to the first output node and the second output node as a reference electric potential. The middle electric potential may be in the middle of an electric potential of the video signal and an electric potential of the offset signal.

According to a fourth aspect of the present invention, in the third aspect, the electric potential of the offset signal may be changeable in accordance with a magnitude of the electric potential of the video signal.

According to a fifth aspect of the present invention, in the third or fourth aspect, a reference signal generating circuit may be connected to the first input node and the second input node. The reference signal generating circuit generates a reference signal. An electric potential of the reference signal may be changeable in accordance with the magnitude of the electric potential of the video signal.

According to a sixth aspect of the present invention, an image sensor may include the AD converter described above and a video signal generating circuit that generates a video signal. The video signal generating circuit may include a plurality of pixels and a plurality of column circuits. The plurality of pixels may be disposed in a matrix pattern. Each column circuit included in the plurality of column circuits may be disposed for each column of the plurality of pixels. One of the AD converter may be disposed in correspondence with each column circuit included in the plurality of column circuits.

According to a seventh aspect of the present invention, an image sensor may include the AD converter described above and a video signal generating circuit that generates a video signal. The video signal generating circuit may include a plurality of pixels and a plurality of column circuits. The plurality of pixels may be disposed in a matrix pattern. Each column circuit included in the plurality of column circuits may be disposed for each column of the plurality of pixels. One of the AD converter may be disposed in correspondence with each of a plurality of subgroups, or one of the AD converter may be disposed in correspondence with the plurality of column circuits. Each subgroup included in the subgroups may include two or more column circuits among the plurality of column circuits.

DETAILED DESCRIPTION OF THE INVENTION

Embodiments of the present invention will be described with reference to the drawings.

First Embodiment

Figure 1:
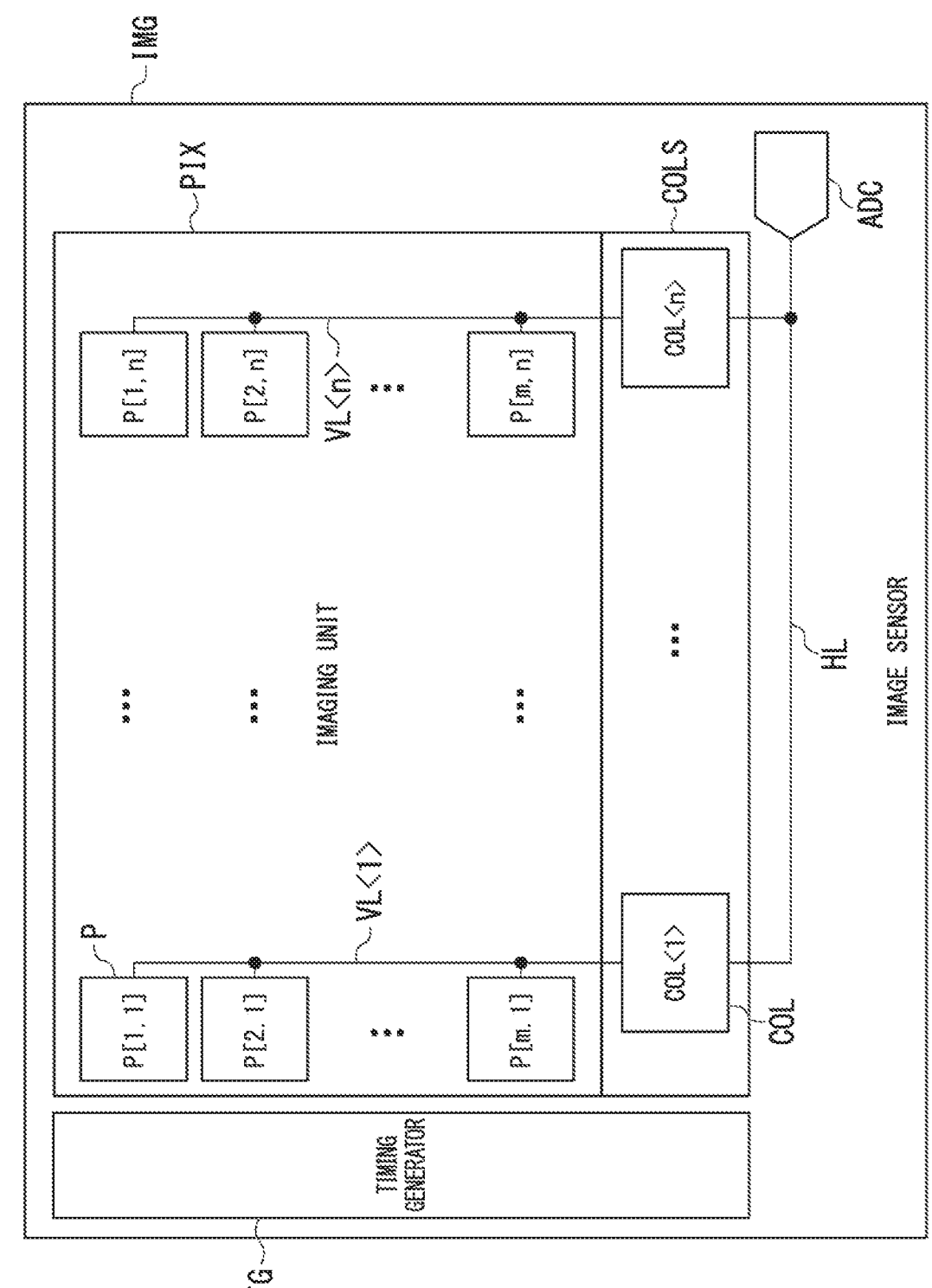
FIG. 1 is a block diagram showing the entire configuration of an image sensor according to a first embodiment of the present invention.

The entire configuration of an image sensor IMG according to a first embodiment of the present invention will be described with reference to FIG. 1. FIG. 1 shows the entire configuration of the image sensor IMG. As shown in FIG. 1, the image sensor IMG includes an imaging unit PIX, a timing generator TG, a column processing unit COLS, and an AD converter ADC.

The imaging unit PIX includes a plurality of pixels P disposed in a matrix pattern. In FIG. 1, some of the plurality of pixels P are not shown. In a case in which a pixel P needs to be distinguished from the others, the pixel P is represented using a row number m and a column number n. Here, m is an arbitrary integer of one or more, and n is an arbitrary integer of two or more. A pixel P disposed in the i-th row and the j-th column is a pixel P[i, j]. Here, i is an integer that is two or more and m or less. In addition, j is an integer that is two or more and n or less. The imaging unit PIX includes m×n pixels P[1, 1] to P[m, n]. In addition, n vertical signal lines VL<1> to VL<n> are disposed in a column direction. The pixels P[1, 1] to P[m, n] are connected to the vertical signal lines VL<1> to VL<n> for each column. In other words, the pixels P[1, j] to P[m, j] of the j-th column are connected to the vertical signal line VL<j>. Each pixel P outputs a voltage signal corresponding to light incident on the pixel P to the column processing unit COLS. The pixel P includes a photodiode and accumulates a signal corresponding to light incident on the pixel P in the photodiode. The pixel P outputs a voltage signal based on the signal accumulated in the photodiode to the column processing unit COLS.

The column processing unit COLS includes a plurality of column circuits COL disposed for each column of a plurality of pixels P. In FIG. 1, some of the plurality of column circuits COL are not shown. In a case in which a column circuit COL needs to be distinguished from the others, the column circuit COL is represented using a column number n. A column circuit COL disposed in the j-th column is a column circuit COL<j>. The column processing unit COLS includes n column circuits COL<1> to COL<n>. The column circuits COL<1> to COL<n> are respectively disposed for the vertical signal lines VL<1> to VL<n>. The column circuit COL<j> of the j-th column is connected to the vertical signal line VL<j>. Signals output from the pixels P[1,j] to P[m, j] of the j-th column are input to the column circuit COL<j> of the j-th column. The column circuits COL<1> to COL<n> are connected to the AD converter ADC through a horizontal signal line HL. The column circuits COL<1> to COL<n> cancel out reset noise and the like included in the voltage signals output from the pixels P[1, 1] to P[m, n]. Accordingly, the column circuits COL<1> to COL<n> generate video signals VSIG and output the video signals VSIG to the AD converter ADC.

The AD converter ADC is connected to the horizontal signal line HL. The AD converter ADC converts video signals VSIG (analog signals) output from the column circuits COL<1> to COL<n> into digital signals.

The timing generator TG is connected to the imaging unit PIX, the column processing unit COLS, and the AD converter ADC by signal lines that are not shown in the drawing. The timing generator TG supplies a signal necessary for controlling the image sensor IMG to each unit.

The video signal VSIG is a signal a reference of which is a reference signal VREF, and the amplitude of the video signal VSIG is VPIX. The video signal VSIG is represented using Equation (1). The video signal VSIG has a negative polarity.

$$VSIG = VREF - VPIX \quad (1)$$

For example, in a case in which a signal supplied from a pixel P is at a minimum level (black level), the video signal VSIG is represented using Equation (2). On the other hand, in a case in which a signal supplied from the pixel P is at a maximum level (saturated level), the video signal VSIG is represented using Equation (3). In Equation (3), VPIX_SAT is a saturated (maximum) voltage of VPIX.

$$VSIG = VREF - 0 \quad (2)$$

$$VSIG = VREF - VPIX\_SAT \quad (3)$$

In the example described above, the video signal VSIG has a negative polarity. However, the video signal VSIG may have a positive polarity.

The column circuits COL<1> to COL<n> constitute a video signal generating circuit that generates a video signal VSIG In the case shown in FIG. 1, one AD converter ADC is disposed in correspondence with the plurality of column circuits COL<1> to COL<n>. In other words, the plurality of column circuits COL<1> to COL<n> are electrically connected to one AD converter ADC.

A high voltage (about 3 V) is necessary for driving the pixels P[1, 1] to P[m, n]. For this reason, the imaging unit PIX is constituted by high breakdown voltage transistors. Since it is necessary to process video signals (about 2.5 V to 1.5 V) output from the pixels P[1, 1] to P[m, n], the column processing unit COLS is also constituted by high breakdown voltage transistors.

As described above, the image sensor IMG includes an AD converter ADC, a plurality of pixels P, and a plurality of column circuits COL. The plurality of pixels P are disposed in a matrix pattern. Each column circuit COL included in the plurality of column circuits COL is disposed for each column of the plurality of pixels P. One AD converter ADC is disposed in correspondence with the plurality of column circuits COL.

Figure 2:
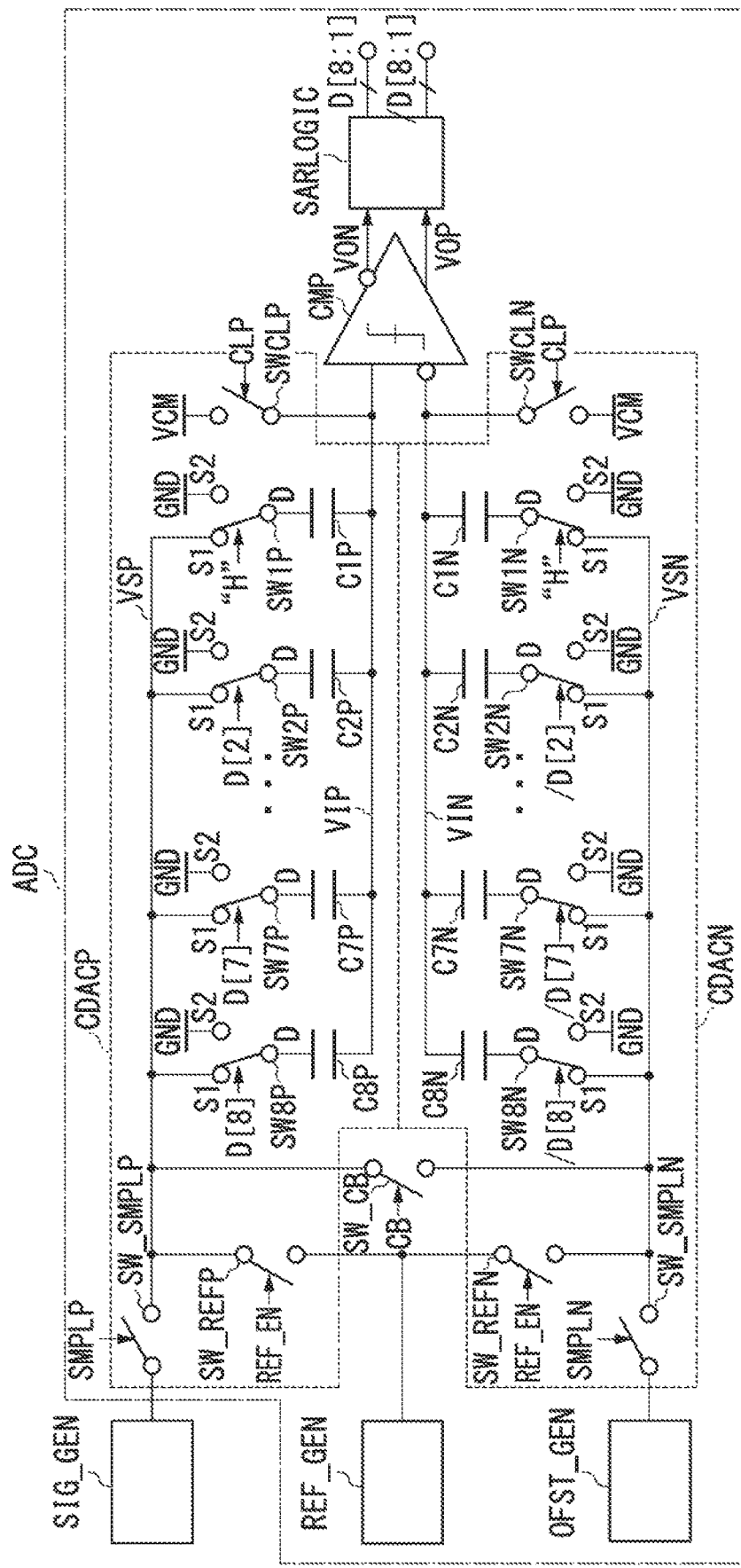
FIG. 2 is a circuit diagram showing the configuration of an AD converter according to the first embodiment of the present invention.

The configuration of the AD converter ADC will be described with reference to FIG. 2. FIG. 2 shows the configuration of the AD converter ADC.

A schematic configuration of the AD converter ADC will be described. The AD converter ADC includes at least a DAC (digital-to-analog converter) circuit CDACP (first DAC circuit), a DAC circuit CDACN (second DAC circuit), a comparison circuit CMP, a control circuit SARLOGIC, and a crowbar switch SW_CB (control switch). The DAC circuit CDACP includes a plurality of DAC capacitors C2P to C8P (first capacitors) weighted with capacitance values. The DAC circuit CDACN includes a plurality of DAC capacitors C2N to C8N (second capacitors) weighted with capacitance values. The comparison circuit CMP is connected to a node VIP (first output node) of the DAC circuit CDACP and a node VIN (second output node) of the DAC circuit CDACN and compares the electric potential of the node VIP with the electric potential of the node VIN. The control circuit SARLOGIC controls the DAC circuit CDACP and the DAC circuit CDACN in accordance with a result of the comparison acquired by the comparison circuit CMP. The crowbar switch SW_CB controls on/off of a connection between the node VSP (first input node) of the DAC circuit CDACP and the node VSN (second input node) of the DAC circuit CDACN.

A detailed configuration of the AD converter ADC will be described. As shown in FIG. 2, the AD converter ADC includes a DAC circuit CDACP, a DAC circuit CDACN, a comparison circuit CMP, a control circuit SARLOGIC, a crowbar switch SW_CB, a reference signal generating circuit REF_GEN, and an offset signal generating circuit OFST_GEN.

The DAC circuit CDACP includes DAC capacitors C1P to C8P, switches SW1P to SW8P, a clamp switch SWCLP, a sample switch SW_SMPLP, and a reference signal input switch SW_REFP.

The sample switch SW_SMPLP includes a first terminal and a second terminal. The first terminal of the sample switch SW_SMPLP is connected to a video signal generating circuit SIG_GEN. The second terminal of the sample switch SW_SMPLP is connected to the node VSP. The state of the sample switch SW_SMPLP is switched between on and off. When the sample switch SW_SMPLP is on, the first terminal and the second terminal of the sample switch SW_SMPLP are electrically connected. At this time, a video signal VSIG from the video signal generating circuit SIG_GEN is input to the node VSP. On the other hand, when the sample switch SW_SMPLP is off, the first terminal and the second terminal of the sample switch SW_SMPLP are in a high-impedance state. The state of the sample switch SW_SMPLP is controlled using a control signal SMPLP. In a case in which the control signal SMPLP is "H (high)," the sample switch SW_SMPLP is on. On the other hand, in a case in which the control signal SMPLP is "L (low)," the sample switch SW_SMPLP is off. The sample switch SW_SMPLP samples a video signal VSIG supplied from the video signal generating circuit SIG_GEN.

Each of the switches SW1P to SW8P includes a first terminal S1, a second terminal S2, and a third terminal D. The first terminal S1 of each of the switches SW1P to SW8P is connected to the node VSP. The second terminal S2 of each of the switches SW1P to SW8P is connected to the ground GND. The third terminal D of each of the switches SW1P to SW81P is connected to one of the DAC capacitors C1P to C8P. The state of each of the switches SW1P to SW8P is switched between a first state and a second state. When each of the switches SW1P to SW8P is in the first state, the first terminal S1 of each of the switches SW1P to SW8P and the third terminal D of each of the switches SW1P to SW8P are electrically connected. At this time, a video signal VSIG supplied from the video signal generating circuit SIG_GEN is input to the DAC capacitors C1P to C8P. When each of the switches SW1P to SW8P is in the second state, the second terminal S2 of each of the switches SW1P to SW8P and the third terminal D of each of the switches SW1P to SW8P are electrically connected. At this time, the amounts of electric charge accumulated in the DAC capacitors C1P to C8P change. The states of the switches SW2P to SW8P are controlled using bits D[2] to D[8] of a result of the AD conversion. In a case in which the bits D[2] to D[8] are "H," the switches SW2P to SW8P are in the first state. On the other hand, in a case in which the bits D[2] to D[8] are "L," the switches SW2P to SW8P are in the second state. A control signal that is constantly "H" is input to the switch SW1P. For this reason, the switch SW1P is maintained in the first state.

Each of the DAC capacitors C1P to C8P includes a first terminal and a second terminal. The first terminals of the DAC capacitors C1P to C8P are respectively connected to the third terminals D of the switches SW1P to SW8P. The second terminal of each of the DAC capacitors C1P to C8P is connected to the node VIP. The DAC capacitors C1P to C8P maintain a video signal VSIG sampled by the sample switch SW_SMPLP The clamp switch SWCLP includes a first terminal and a second terminal. The first terminal of the clamp switch SWCLP is connected to a common mode signal generating circuit that is not shown in the drawing. The second terminal of the clamp switch SWCLP is connected to the node VIP. The state of the clamp switch SWCLP is switched between on and off. When the clamp switch SWCLP is on, the first terminal and the second terminal of the clamp switch SWCLP are electrically connected. At this time, a common mode signal VCM supplied from the common mode signal generating circuit is input to the node VIP. On the other hand, when the clamp switch SWCLP is off, the first terminal and the second terminal of the clamp switch SWCLP are in the high-impedance state. The state of the clamp switch SWCLP is controlled using a control signal CLP. In a case in which the control signal CLP is "H," the clamp switch SWCLP is on. On the other hand, in a case in which the control signal CLP is "L," the clamp switch SWCLP is off. The clamp switch SWCLP inputs the common node signal VCM to the node VIP.

The reference signal input switch SW_REFP includes a first terminal and a second terminal. The first terminal of the reference signal input switch SW_REFP is connected to a reference signal generating circuit REF_GEN. The second terminal of the reference signal input switch SW_REFP is connected to the node VSP. The state of the reference signal input switch SW_REFP is switched between on and off. When the reference signal input switch SW_REFP is on, the first terminal and the second terminal of the reference signal input switch SW_REFP are electrically connected. At this time, a reference signal VREF supplied from the reference signal generating circuit REF_GEN is input to the node VSP. When the reference signal input switch SW_REFP is off, the first terminal and the second terminal of the reference signal input switch SW_REFP are in the high-impedance state. The state of the reference signal input switch SW_REFP is controlled using a control signal REF_EN. In a case in which the control signal REF_EN is "H," the reference signal input switch SW_REFP is on. On the other hand, in a case in which the control signal REF_EN is "L." the reference signal input switch SW_REFP is off. The reference signal input switch SW_REFP inputs the reference signal VREF to the node VSP.

The DAC circuit CDACN includes DAC capacitors C1N to C8N, switches SW1N to SW8N, a clamp switch SWCLN, a sample switch SW_SMPLN, and a reference signal input switch SW_REFN.

The sample switch SW_SMPLN includes a first terminal and a second terminal. The first terminal of the sample switch SW_SMPLN is connected to an offset signal generating circuit OFST_GEN. The second terminal of the sample switch SW_SMPLN is connected to the node VSN. The state of the sample switch SW_SMPLN is switched between on and off. When the sample switch SW_SMPLN is on, the first terminal and the second terminal of the sample switch SW_SMPLN are electrically connected. At this time, an offset signal VOFST supplied from the offset signal generating circuit OFST_GEN is input to the node VSN. When the sample switch SW_SMPLN is off, the first terminal and the second terminal of the sample switch SW_SMPLN are in a high-impedance state. The state of the sample switch SW_SMPLN is controlled using a control signal SMPLN. In a case in which the control signal SMPLN is "H," the sample switch SW_SMPLN is on. On the other hand, in a case in which the control signal SMPLN is "L" the sample switch SW_SMPLN is off. The sample switch SW_SMPLN samples an offset signal VOFST supplied from the offset signal generating circuit OFST_GEN.

Each of the switches SW1N to SW8N includes a first terminal S1, a second terminal S2, and a third terminal D. The first terminal S1 of each of the switches SW1N to SW8N is connected to the node VSN. The second terminal S2 of each of the switches SW1N to SW8N is connected to the ground GND. The third terminals D of the switches SW1N to SW8N are respectively connected to the DAC capacitors C1N to C8N. The state of each of the switches SW1N to SW8N is switched between a first state and a second state. When each of the switches SW1N to SW8N is in the first state, the first terminal S1 of each of the switches SW1N to SW8N and the third terminal D of each of the switches SW1N to SW8N are electrically connected. At this time, an offset signal VOFST supplied from the offset signal generating circuit OFST_GEN is input to the DAC capacitors C1N to C8N. When each of the switches SW1N to SW8N is in the second state, the second terminal S2 of each of the switches SW1N to SW8N and the third terminal D of each of the switches SW1N to SW8N are electrically connected. At this time, the amounts of electric charge accumulated in the DAC capacitors C1N to C8N change. The states of the switches SW2N to SW8N are controlled using bits /D[2] to /D[8] of a result of the AD conversion. In a case in which the bits /D[2] to /D[8] are "H," the switches SW2N to SW8N are in the first state. On the other hand, in a case in which the bits /D[2] to /D[8] are "L," the switches SW2N to SW8N are in the second state. A control signal that is constantly "H" is input to the switch SW1N. For this reason, the switch SW1N is maintained in the first state.

Each of the DAC capacitors C1N to C8N includes a first terminal and a second terminal. The first terminals of the DAC capacitors C1N to C8N are respectively connected to the third terminals D of the switches SW1N to SW8N. The second terminals of the DAC capacitors C1N to C8N are connected to the node VIN. The DAC capacitors C1N to C8N maintain an offset signal VOFST sampled by the sample switch SW_SMPLN.

The clamp switch SWCLN includes a first terminal and a second terminal. The first terminal of the clamp switch SWCLN is connected to the common mode signal generating circuit that is not shown in the drawing. The second terminal of the clamp switch SWCLN is connected to the node VIN. The state of the clamp switch SWCLN is switched between on and off. When the clamp switch SWCLN is on, the first terminal and the second terminal of the clamp switch SWCLN are electrically connected. At this time, a common mode signal VCM supplied from the common mode signal generating circuit is input to the node VIN. On the other hand, when the clamp switch SWCLN is off, the first terminal and the second terminal of the clamp switch SWCLN are in a high-impedance state. The state of the clamp switch SWCLN is controlled using a control signal CLP. In a case in which the control signal CLP is "H," the clamp switch SWCLN is on. On the other hand, in a case in which the control signal CLP is "L," the clamp switch SWCLN is off. The clamp switch SWCLN inputs the common mode signal VCM to the node VIN.

The reference signal input switch SW_REFN includes a first terminal and a second terminal. The first terminal of the reference signal input switch SW_REFN is connected to the reference signal generating circuit REF_GEN. The second terminal of the reference signal input switch SW_REFN is connected to the node VSN. The state of the reference signal input switch SW_REFN is switched between on and off. When the reference signal input switch SW_REFN is on, the first terminal and the second terminal of the reference signal input switch SW_REFN are electrically connected. At this time, a reference signal VREF supplied from the reference signal generating circuit REF_GEN is input to the node VSN. When the reference signal input switch SW_REFN is off, the first terminal and the second terminal of the reference signal input switch SW_REFN are in a high-impedance state. The state of the reference signal input switch SW_REFN is controlled using a control signal REFN_EN. In a case in which the control signal REFN_EN is "H" the reference signal input switch SW_REFN is on. On the other hand, in a case in which the control signal REFN_EN is "L," the reference signal input switch SW_REFN is off. The reference signal input switch SW_REFN inputs the reference signal VREF to the node VSN.

The capacitance values of the DAC capacitors C2P to C8P and the DAC capacitors C2N to C8N are weighted. For the convenience of description, the capacitance value of each DAC capacitor is represented using a reference sign of the corresponding DAC capacitor. The capacitance values of the DAC capacitors C2P to C8P and the DAC capacitors C2N to C8N are represented by Equation (4).

$$C8P=C8N=C/2^1, C7P=C7N=C/2^2, \ldots C2P=C2N=C/2^7 \quad (4)$$

The DAC capacitor C1P and the DAC capacitor C1N are capacitors having characteristics of dummy capacitors. The capacitance values of the DAC capacitor C1P and the DAC capacitor C1N are represented by Equation (5).

$$C1P=C1N=C/2^7 \quad (5)$$

The DAC capacitor C1P and the DAC capacitor C1N are necessary for causing a sum value of the capacitance values of the DAC circuit CDACP and the DAC circuit CDACN to be C. Here, C is represented using Equation (6).

$$C=C/2^1+C/2^2 \ldots +C/2^7+C/2^7 \quad (6)$$

The DAC capacitor C1P and the DAC capacitor C1N having characteristics of dummy capacitors are not essential elements for the configuration of the AD converter ADC. However, the DAC capacitor C1P and the DAC capacitor C1N are elements that are necessary for the simplification of description to be presented later and realization of an AD converter having high accuracy in actual design. For this reason, in each embodiment of the present invention, the DAC capacitor C1P and the DAC capacitor C1N are intentionally described.

The DAC circuit CDACP and the DAC circuit CDACN perform a sampling operation and an AD conversion operation. In the sampling operation, electric charge corresponding to a video signal VSIG input to the DAC circuit CDACP is sampled in each of the DAC capacitors C1P to C8P. In the sampling operation, electric charge corresponding to an offset signal VOFST input to the DAC circuit CDACN is sampled in each of the DAC capacitors C1N to C8N. In the AD conversion operation, AD conversions are sequentially performed on the basis of electric charge sampled in each of the DAC capacitors C1P to C8P or the DAC capacitors C1N to C8N by the sampling operation.

In the sampling operation, electric charge based on a difference between the electric potential of the video signal VSIG input to the node VSP of the DAC circuit CDACP and the electric potential of the node VIP of the DAC circuit CDACP in other words, the electric potential of the common mode signal VCM is sampled in the DAC capacitors C1P to C8P. In the sampling operation, electric charge based on a difference between the electric potential of the offset signal VOFST input to the node VSN of the DAC circuit CDACN and the electric potential of the node VIN of the DAC circuit CDACN, in other words, the electric potential of the common mode signal VCM is sampled in the DAC capacitors C1N to C8N.

The video signal generating circuit SIG_GEN is connected to one of the node VSP of the DAC circuit CDACP and the node VSN of the DAC circuit CDACN. The video signal generating circuit SIG_GEN generates a video signal VSIG. The offset signal generating circuit OFST_GEN is connected to a node other than the node to which the video signal generating circuit SIG_GEN is connected out of the node VSP and the node VSN. The offset signal generating circuit OFST_GEN generates an offset signal VOFST. In the AD converter ADC shown in FIG. 2, the video signal generating circuit SIG_GEN is connected to the node VSP through the sample switch SW_SMPLP, and the offset signal generating circuit OFST_GEN is connected to the node VSN through the sample switch SW_SMPLN.

The reference signal generating circuit REF_GEN is connected to the node VSP of the DAC circuit CDACP and the node VSN of the DAC circuit CDACN. The reference signal generating circuit REF_GEN generates a reference signal VREF.

The DAC circuit CDACP is connected to the video signal generating circuit SIG_GEN and the reference signal generating circuit REF_GEN. The DAC circuit CDACN is connected to the offset signal generating circuit OFST_GEN and the reference signal generating circuit REF_GEN. The video signal VSIG generated by the video signal generating circuit SIG_GEN is supplied to the node VSP. The video signal generating circuit SIG_GEN includes the imaging unit PIX and the column processing unit COLS shown in FIG. 1. The offset signal VOFST generated by the offset signal generating circuit OFST_GEN is supplied to the node VSN. The reference signal VREF generated by the reference signal generating circuit REF_GEN is supplied to the node VSP and the node VSN.

The crowbar switch SW_CB includes a first terminal and a second terminal. The first terminal of the crowbar switch SW_CB is connected to the node VSP of the DAC circuit CDACP. The second terminal of the crowbar switch SW_CB is connected to the node VSN of the DAC circuit CDACN. The state of the crowbar switch SW_CB is switched between on and off. When the crowbar switch SW_CB is on, the first terminal and the second terminal of the crowbar switch SW_CB are electrically connected. At this time, in accordance with changes in the electric potentials of the node VSP and the node VSN, full-differential signals are generated at the node VIP and the node VIN. When the crowbar switch SW_CB is off, the first terminal and the second terminal of the crowbar switch SW_CB are in a high impedance state. The state of the crowbar switch SW_CB is controlled using a control signal CB. In a case in which the control signal CB is "H," the crowbar switch SW_CB is on. On the other hand, in a case in which the control signal CB is "L," the crowbar switch SW_CB is off. After sampling of the video signal VSIG and the offset signal VOFST ends, the crowbar switch SW_CB connects the node VSP of the DAC circuit CDACP and the node VSN of the DAC circuit CDACN.

The node VSP is connected to the second terminal of the sample switch SW_SMPLP, the second terminal of the reference signal input switch SW_REFP, the first terminal of the crowbar switch SW_CB, and the first terminals S of the switches SW1P to SW8P. The node VSP is an arbitrary position on a signal line that is electrically connected to these. The node VSN is connected to the second terminal of the sample switch SW_SMPLN, the second terminal of the reference signal input switch SW_REFN, the second terminal of the crowbar switch SW_CB, and the first terminals S1 of the switches SW1N to SW8N. The node VSN is an arbitrary position on a signal line that is electrically connected to these.

The node VIP is connected to the second terminals of the DAC capacitors C1P to C8P the second terminal of the clamp switch SWCLP, and the first input terminal of the comparison circuit CMP. The node VIP is an arbitrary position on a signal line that is electrically connected to these. The node VIN is connected to the second terminals of the DAC capacitors C1N to C8N, the second terminal of the clamp switch SWCLN, and the second input terminal of the comparison circuit CMP. The node VIN is an arbitrary position on a signal line that is electrically connected to these.

The comparison circuit CMP includes a first input terminal (non-inverted input terminal), a second input terminal (inverted input terminal), a first output terminal (inverted output terminal), and a second output terminal (non-inverted output terminal). The first input terminal of the comparison circuit CMP is connected to the node VIP. An electric potential based on the video signal VSIG, the reference signal VREF, and the common mode signal VCM is input to the first input terminal of the comparison circuit CMP. The second input terminal of the comparison circuit CMP is connected to the node VIN. An electric potential based on the offset signal VOFST, the reference signal VREF, and the common mode signal VCM is input to the second input terminal of the comparison circuit CMP. The first output terminal and the second output terminal of the comparison circuit CMP are connected to the control circuit SARLOGIC. The comparison circuit CMP compares the electric potential of the node VIP with the electric potential of the node VIN. The comparison circuit CMP outputs a signal VON based on a result of the comparison from the first output terminal and outputs a signal VOP based on the result of the comparison from the second output terminal.

The control circuit SARLOGIC includes a first input terminal, a second input terminal, a first output terminal, and a second output terminal. The first input terminal of the control circuit SARLOGIC is connected to the first output terminal of the comparison circuit CMP. The second input terminal of the control circuit SARLOGIC is connected to the second output terminal of the comparison circuit CMP. The signal VON is input to the first input terminal of the control circuit SARLOGIC, and the signal VOP is input to the second input terminal of the control circuit SARLOGIC.

The control circuit SARLOGIC generates a digital signal D[8:1] and a digital signal /D[8:1] that are results of the AD conversion on the basis of the signal VOP and the signal VON supplied from the comparison circuit CMP. The control circuit SARLOGIC outputs the digital signal D[8:1] from the first output terminal and outputs the digital signal /D[8:1] from the second output terminal. While the AD converter ADC is an AD converter of an 8-bit output, the AD converter is not limited to this example. The number of output bits of the AD converter ADC may be arbitrarily set.

Bits D[2] to D[8] constituting the digital signal D[8:1] are respectively output to the switches SW2P to SW8P of the DAC circuit CDACP. By respectively outputting the bits D[2] to D[8] to the switches SW2P to SW8P, the control circuit SARLOGIC controls the DAC circuit CDACP. Bits /D[2] to /D[8] constituting the digital signal /D[8:1] are respectively output to the switches SW2N to SW8N of the DAC circuit CDACN. By respectively outputting the bits /D[2] to /D[8] to the switches SW2N to SW8N, the control circuit SARLOGIC controls the DAC circuit CDACN. A bit D[1] and a bit /D[1] constituting the digital signal D[8:1] are not used for controlling the DAC circuit CDACP and the DAC circuit CDACN.

Figure 3:
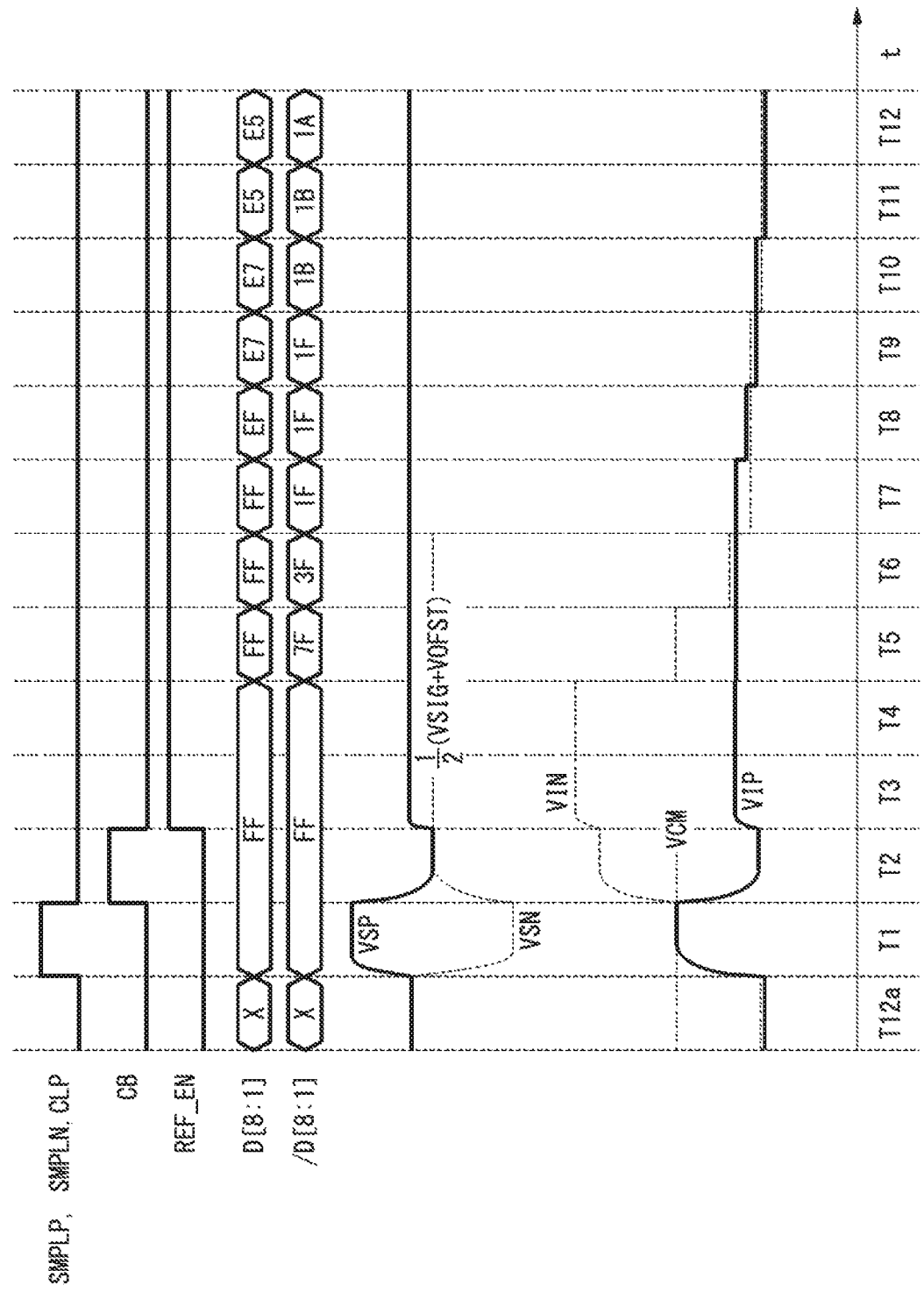
FIG. 3 is a timing diagram showing an operation of an AD converter according to the first embodiment of the present invention.

The operation of the AD converter ADC will be described with reference to FIG. 3. FIG. 3 shows signals relating to the operation of the AD converter ADC. In FIG. 3, a control signal SMPLP a control signal SMPLN, a control signal CLP, a control signal CB, and a control signal REF_EN are shown. In FIG. 3, a digital signal D[8:1] and a digital signal /D[8:1] are represented in hexadecimal digits. In FIG. 3, the electric potentials of a node VSP, a node VSN, a node VIP, and a node VIN are shown. In FIG. 3, the horizontal axis represents time, and the vertical axis represents a signal level.

In FIG. 3, operations in periods T1 to T12 and a period T12a are shown. The operations in the periods T1 to T12 constitute a basic sequence. The AD converter ADC repeats the basic sequence for each AD conversion operation of a sampled signal. The period T12a is a period in which an AD conversion of the previous sample ends. The operation in the period T12a is equivalent to the operation in the period T12.

The period T1 is a period for sampling a signal input to the AD converter ADC. In the period T1, the first terminals S1 and the third terminals D of the switches SW1P to SW8P and the switches SW1N to SW8N are connected. In the period T1, the switch SW_SMPLP, the switch SW_SMPLN, the clamp switch SWCLP, and the clamp switch SWCLN are on. By causing the switch SW_SMPLP to be turned on, a video signal VSIG is input to the node VSP. By causing the switch SW_SMPLN to be turned on, an offset signal VOFST is input to the node VSN. Accordingly, the video signal VSIG and the offset signal VOFST are sampled. By causing the clamp switch SWCLP and the clamp switch SWCLN to be turned on, a common mode signal VCM is input to the node VIP and the node VIN.

In the period T1, electric charge based on the video signal VSIG and the common mode signal VCM is maintained in the DAC capacitors C1P to C8P, and electric charge based on the offset signal VOFST and the common mode signal VCM is maintained in the DAC capacitors C1N to C8N. The electric charge QP maintained in the DAC capacitors C1P to C81P is represented using Equation (7). The electric charge QN maintained in the DAC capacitors C1N to C8N is represented using Equation (8). For the convenience of description, the electric potential of the video signal VSIG is represented by VSIG, the electric potential of the offset signal VOFST is represented by VOFST, and the electric potential of the common mode signal VCM is represented by VCM.

$$QP=C(VSIG-VCM) \tag{7}$$

$$QN=C(VOFST-VCM) \tag{8}$$

The period T2 is a period for converting a single end signal input to the AD converter ADC into a full differential signal. This conversion is realized when the crowbar switch SW_CB is turned on after the switch SW_SMPLP, the switch SW_SMPLN, the clamp switch SWCLP, and the clamp switch SWCLN are turned off. By causing the switch SW_SMPLP to be turned off, the input of the video signal VSIG is stopped. By causing the switch SW_SMPLN to be turned off, the input of the offset signal VOFST is stopped. By causing the clamp switch SWCLP and the clamp switch SWCLN to be turned off, the input of the common mode signal VCM is stopped.

By causing the crowbar switch SW_CB to be turned on, the node VSP and the node VSN are connected. As a result, the electric potentials of the node VSP and the node VSN change to a middle electric potential, that is, ½(VSIG+ VOSFT). By applying the law of conservation of electric charge to a state before the crowbar switch SW_CB is turned on and a state after the crowbar switch SW_CB is turned on, the electric potentials of the node VIP and the node VIN in the period T2 can be acquired. The electric potential of the node VIP is represented using Equation (9), and the electric potential of the node VIN is represented using Equation (10). As represented using Equation (9) and Equation (10), a variable gain amplifier is not necessary, and a full differential signal having a desired offset voltage VOFST is generated.

$$VIP=VCM-(½)(VSIG-VOFST) \tag{9}$$

$$VIN=VCM+(½)(VSIG-VOFST) \tag{10}$$

In the period T3, the crowbar switch SW_CB is turned off, and the reference signal input switch SW_REFP and the reference signal input switch SW_REFN are turned on. By causing the reference signal input switch SW_REFP and the reference signal input switch SW_REFN to be turned on, the reference signal VREF is input to the node VIP and the node VIN. Accordingly, preparation of the AD conversion is completed. In the period T3, the electric potentials of the node VSP and the node VSN are shifted upward by (½)·VREF. Here, VREF is the electric potential of the reference signal VREF. The electric potential of the node VIP is represented using Equation (11), and the electric potential of the node VIN is represented using Equation (12).

$$VIP=-VSIG+VCM+(½)·VREF \tag{11}$$

$$VIN=-VOFST+VCM+(½)·VREF \tag{12}$$

The period T4 to the period T12 corresponds to a period for the AD converter ADC to perform comparisons of the MSB to the LSB. In the period T4, the comparison circuit CMP compares the electric potential of the node VIP with the electric potential of the node VIN. In accordance with this comparison, the logic of the most significant bit of the result of the AD conversion is decided. As a result, the state of a switch disposed on a higher electric potential node out of the node VIP and the node VIN is switched. In the example shown in FIG. 3, since the electric potential of the node VIN is higher than the electric potential of the node VIP in the period T4, the bit /D[8] is switched from "H" to "L." The bit D[8] is maintained to be "H." In the period T5, the digital signal /D[8:1] represented in hexadecimal digits is switched from FF (11111111) to 7F (01111111). The switch SW8N controlled using the bit /D[8] is switched to a state in which the second terminal S2 and the third terminal D are connected. For this reason, electric charge accumulated in each of the DAC capacitors C1N to C8N changes. As a result, the electric potential of the node VIN decreases by (½)·VREF.

After the switching ends, in the period T5, the comparison circuit CMP compares the electric potential of the node VIP with the electric potential of the node VIN. In accordance with this comparison, the logic of a second bit from the MSB in the result of the AD conversion is decided. In the period T5, since the electric potential of the node VIN is higher than the electric potential of the node VIP, the bit /D[7] is switched from "H" to "L." In the period T6, the digital signal /D[8:1] is switched front 7F (0111111) to 3F (00111111). In accordance with a change in the state of the switch SW7N controlled using the bit /D[7], the electric potential of the node VIN decreases by ($\frac{1}{2}^2$)·VREF.

Similarly, in the period T6 to the period T11, 3rd to 8th bits from the MSB in the result of the AD conversion are decided. The amount of decrease in the electric potential of the node VIP or the node VIN occurring after the decision of the N-th bit from the MSB in the result of the AD conversion is ($\frac{1}{2}^N$)·VREF.

In the period T6, since the electric potential of the node VIN is higher than the electric potential of the node VIP, the bit /D[6] is switched from "H" to "L." In the period T7, the digital signal /D[8:1] is switched from 3F (00111111) to 1F (00011111). In accordance with a change in the state of the switch SW6N controlled using the bit /D[6], the electric potential of the node VIN decreases by ($\frac{1}{2}^3$)·VREF.

In the period T7, since the electric potential of the node VIP is higher than the electric potential of the node VIN, the bit D[5] is switched from "H" to "L" In the period T8, the digital signal D[8:1] is switched from FF (1111111) to EF (11101111). In accordance with a change in the state of the switch SW5P controlled using the bit D[5], the electric potential of the node VIP decreases by ($\frac{1}{2}^4$)·VREF.

In the period T8, since the electric potential of the node VIP is higher than the electric potential of the node VIN, the bit D[4] is switched from "H" to "L." In the period T9, the digital signal D[8:1] is switched from EF (11101111) to E7 (11100111). In accordance with a change in the state of the switch SW4P controlled using the bit D[4], the electric potential of the node VIP decreases by ($\frac{1}{2}^5$)·VREF In the period T9, since the electric potential of the node VIN is higher than the electric potential of the node VIP, the bit /D[3] is switched from "H" to "L." In the period T10, the digital signal /D[8:1] is switched from 1F (00011111) to 1B (00011011). In accordance with a change in the state of the switch SW3N controlled using the bit /D[3], the electric potential of the node VIN decreases by ($\frac{1}{2}^6$)·VREF.

In the period T10, since the electric potential of the node VIP is higher than the electric potential of the node VIN, the bit D[2] is switched from "H" to "L." In the period T11, the digital signal D[8:1] is switched from E7 (11100111) to 0.5 (11100101). In accordance with a change in the state of the switch SW2P controlled using the bit D[2], the electric potential of the node VIP decreases by ($\frac{1}{2}^7$)·VREF.

In the period T1, since the electric potential of the node VIN is higher than the electric potential of the node VIP, the bit /D[1] is switched from "H" to "L." In the period T12, the digital signal /D[8:1] is switched from 1B (00011011) to 1A (00011010).

As a result of the decision in the period T11, the bit D[1] or the bit /D[1] in the period T12 changes. The signal line of such a bit is not connected to the switch SW1P and the switch SW1N. For this reason, the DAC capacitor C1P and the DAC capacitor C1N are not controlled in accordance with the result of the decision. In other words, in the period T11, although the decision of the LSB is performed, the switching of the switch is not performed. The digital signal D[8:1] acquired in this way is used by an external signal processing system.

At least one of the electric potential of the offset signal VOFST and the electric potential of the reference signal VREF may be changeable in accordance with the magnitude of the electric potential of the video signal VSIG In other words, the offset signal generating circuit OFST_GEN may have a function of changing the voltage value of the offset signal VOFST in accordance with the amplitude of the video signal VSIG. The reference signal generating circuit REF_GEN may have a function of changing the voltage value of the reference signal VREF in accordance with the amplitude of the video signal VSIG. Only one of the electric potential of the offset signal VOFST and the electric potential of the reference signal VREF may be configured to be changeable.

Figure 4:
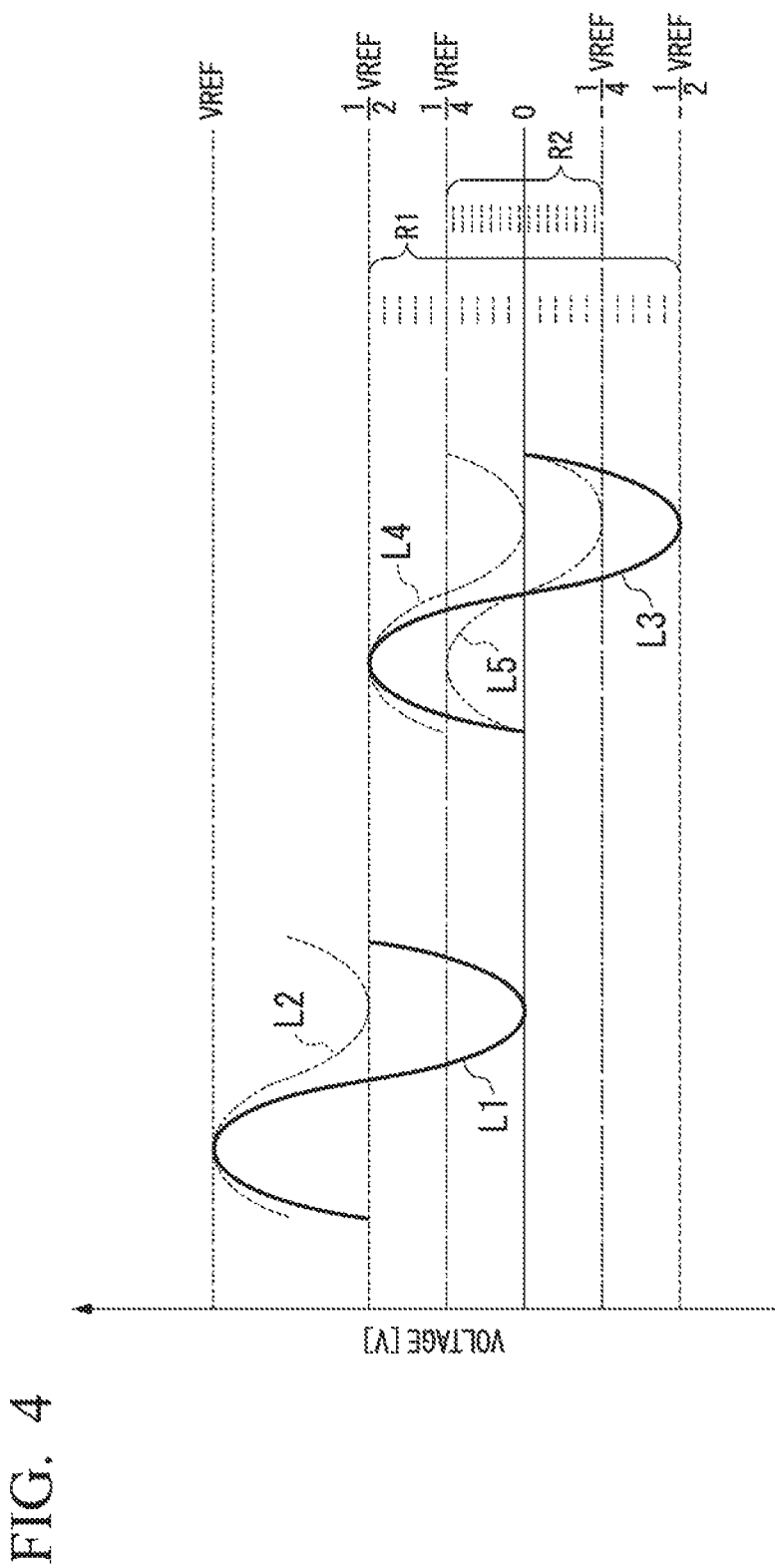
FIG. 4 is a graph showing a video signal and the full scale of an AD converter according to the first embodiment of the present invention.

FIG. 4 shows a video signal VSIG and the full scale of the AD converter ADC. The full scale of the AD converter ADC is a range of input voltages for which the AD converter ADC can perform an AD conversion. In FIG. 4, the vertical axis represents a voltage. A line L1 and a line L2 show video signals VSIG input to the AD converter ADC. A line L3, a line L4, and a line L5 show video signals VSIG, for which a conversion from a single end signal to a full scale signal has been performed, after the application of an offset signal VOFST. The line L1 shows a video signal VSIG of which the amplitude is VREF. The line L2 shows a video signal VSIG of which the amplitude is (½)·VREF. The line L3 shows a single end representation of a video signal VSIG in a case in which the video signal VSIG shown by the line L1 is converted into a full scale signal, and the electric potential of the offset signal VOFST is (−½)·VREF. The line L4 shows a video signal VSIG in a case in which the video signal VSIG shown by the line L2 is converted into a full scale signal, and the electric potential of the offset signal VOFST is (−½)·VREF. A line L5 shows a video signal VSIG in a case in which the video signal VSIG shown by the line L2 is converted into a full scale signal, and the electric potential of the offset signal VOFST is (−¾)·VREF. When the electric potential of the offset signal VOFST changes, a voltage that is an AD conversion target changes.

A range R1 and a range R2 show full scales of the AD converter ADC. The range R1 corresponds to a case in which the electric potential of the reference signal VREF is (I/2)·VREF. In such a case, the full scale of the AD converter ADC is a size of (−½)·VREF to (½)·VREF, in other words, VREF. A range acquired by equally dividing the range R1 by 256, in other words, (1/256)·VREF corresponds to one LSB. The number used for equally dividing the range R1 is based on the number of DAC capacitors. Since each of the DAC circuits CDACP and the DAC circuits CDACN has eight DAC capacitors, 256 that is $2^8$ is the number used for equally dividing the range R1. The range R2 corresponds to a case in which the electric potential of the reference signal VREF is (¼)·VREF. In such a case, the full scale of the AD converter ADC is a size of (−¼)·VREF to (¼)·VREF, in other words, (½)·VREF. A range acquired by equally dividing the range R2 by 256, in other words, (1/512)·VREF corresponds to one LSB. The range of one LSB in the range R2 is smaller than the range of one LSB in the range R1. For this reason, the resolution of the AD converter ADC for the range R2 is higher than the resolution of the AD converter ADC for the range R1. The resolution of the AD converter ADC for the range R2 is twice the resolution of the AD converter ADC for the range R1. For this reason, the AD converter ADC can perform an AD conversion of a video signal with a resolution that is substantially equivalent to that of a case in which a programmable gain amplifier amplifies the video signal such that it is doubled. When the electric potential of the reference signal VREF changes, the full scale and the resolution of the AD converter ADC change.

For example, in a case in which the video signal VSIG is represented by the line L3, and the full scale of the AD converter ADC is set as the range R1, the AD converter ADC can perform an AD conversion of the full scale of an input voltage. In a case in which the video signal VSIG is represented by the line L4, and the full scale of the AD converter ADC is set as the range R2, although the AD converter ADC can perform an AD conversion of a signal included in a range of (¼)·VREF to "0," the AD converter ADC cannot perform an AD conversion of a signal included in a range of (¼)·VREF to (½)·VREF. However, in a case in which the electric potential of the offset signal VOFST is set as (−¾)·VREF, as shown by the line L5, the full scale of the input voltage is included in the range R2. In other words, in a case in which the amplitude of a video signal VSIG is (½)·VREF, the electric potential of the offset signal VOFST output by the offset signal generating circuit OFST_GEN may be set as (−¾)·VREF, and the electric potential of the reference signal VREF output by the reference signal generating circuit REF_GEN may be set as (¼)·VREF. In this way, the AD converter ADC can perform an AD conversion of the full scale of the input voltage with high precision.

The AD converter according to each aspect of the present invention need not include at least one of the reference signal generating circuit REF_GEN and the offset signal generating circuit OFST_GEN. Each of the first DAC circuit and the second DAC circuit of the AD converter according to each aspect of the present invention need not include the components other than the DAC capacitors. A signal that is input to the AD converter according to each aspect of the present invention and is a target for the AD conversion may be a signal other than a video signal. The image sensor according to each aspect of the present invention need not include the components other than the plurality of pixels, the plurality of column circuits, and the AD converter.

In the AD converter ADC according to the first embodiment, the crowbar switch SW_CB connects the node VSP of the DAC circuit CDACP and the node VSN of the DAC circuit CDACN. Accordingly, the AD converter ADC functions as a full-differential type AD converter. In the ADC of the AD converter, a gain block of a CMOS image sensor according to a conventional technology is not necessary. For this reason, the chip area of the AD converter ADC can be decreased. As a result, the AD converter ADC can decrease the power consumption.

Since the electric potential of the offset signal VOFST is changeable, a voltage that is an AD conversion target is changeable such that it is appropriate for the full scale of the AD converter ADC. Since the electric potential of the reference signal VREF is changeable, the full scale and the resolution of the AD converter ADC is changeable. By controlling the electric potentials of the offset signal VOFST and the reference signal VREF in accordance with the electric potential of a video signal VSIG the AD converter ADC can effectively use the range of the input voltage for which the AD conversion can be performed and can perform an AD conversion with high resolution.

In a case in which the AD converter ADC is mounted in the image sensor IMG, a decrease in the size and low power consumption of the image sensor IMG can be realized.

First Modified Example of First Embodiment

Figure 5:
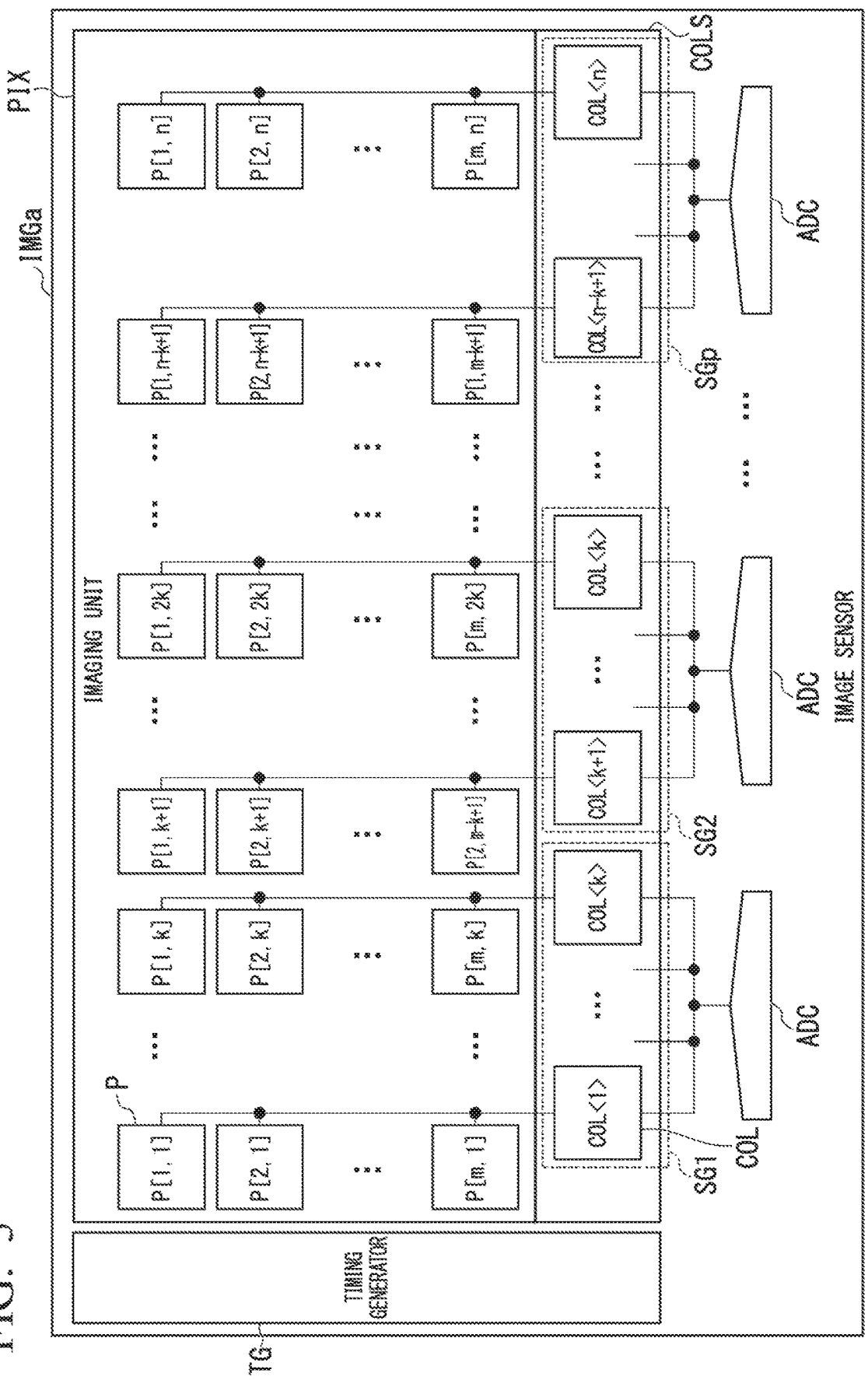
FIG. 5 is a block diagram showing the entire configuration of an image sensor according to a first modified example of the first embodiment of the present invention.

The entire configuration of an image sensor IMGa according to a first modified example of the first embodiment will be described with reference to FIG. 5. FIG. 5 shows the entire configuration of the image sensor IMGa. In the configuration shown in FIG. 5, points different from the configuration shown in FIG. 1 will be described.

An image sensor IMGa includes a plurality of AD converters ADC. Each column circuit COL included in a plurality of column circuits COL is included in one subgroup included in a plurality of subgroups SG1 to SGp. Here, p is an integer of two or more. The number of the plurality of subgroups SG1 to SGp is smaller than the number of columns of a plurality of pixels P. One subgroup includes two or more column circuits COL included in the plurality of column circuits COL. For example, the subgroup SG1 includes first to k-th column circuits COL<1> to COL<k>. Here, k is an integer of two or more. One AD converter ADC is disposed in correspondence with each subgroup included in the plurality of subgroups SG1 to SGp. In the example shown in FIG. 5, p subgroups and p AD converters ADC are disposed. In other words, one AD converter ADC is disposed for each subgroup. Two or more column circuits COL included in one subgroup are electrically connected to one AD converter ADC. In the configuration shown in FIG. 5, points other than those described above are similar to the configuration shown in FIG. 1.

In the image sensor IMGa, a plurality of AD converters ADC disposed for the subgroups can perform AD conversions in parallel. For this reason, the image sensor IMGa can perform imaging at a higher speed.

Second Modified Example of First Embodiment

Figure 6:
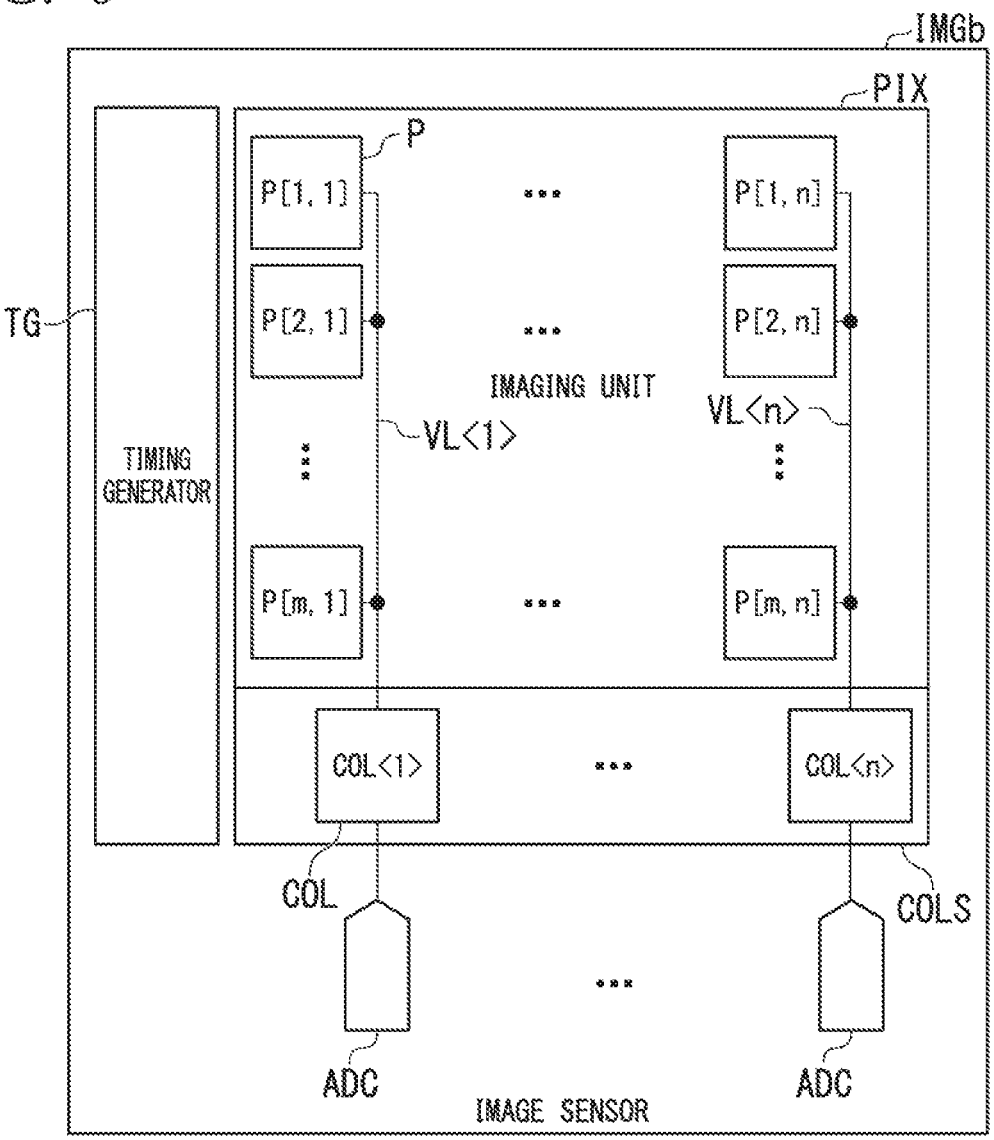
FIG. 6 is a block diagram showing the entire configuration of an image sensor according to a second modified example of the first embodiment of the present invention.

The entire configuration of an image sensor IMGb according to a second modified example of the first embodiment will be described with reference to FIG. 6. FIG. 6 shows the entire configuration of the image sensor IMGb. In the configuration shown in FIG. 6, points different from the configuration shown in FIG. 1 will be described.

The image sensor IMGb includes a plurality of AD converters ADC. One AD converter ADC is disposed in correspondence with each column circuit COL included in a plurality of column circuits COL. In other words, each column circuit COL included in the plurality of column circuits COL is electrically connected to one AD converter ADC. In the configuration shown in FIG. 6, points other than those described above are similar to the configuration shown in FIG. 1.

In the image sensor IMGb, the plurality of AD converters ADC disposed in correspondence with the plurality of column circuits COL can perform AD conversions in parallel. For this reason, the image sensor IMGb can perform imaging at a higher speed.

Third Modified Example of First Embodiment

Figure 7:
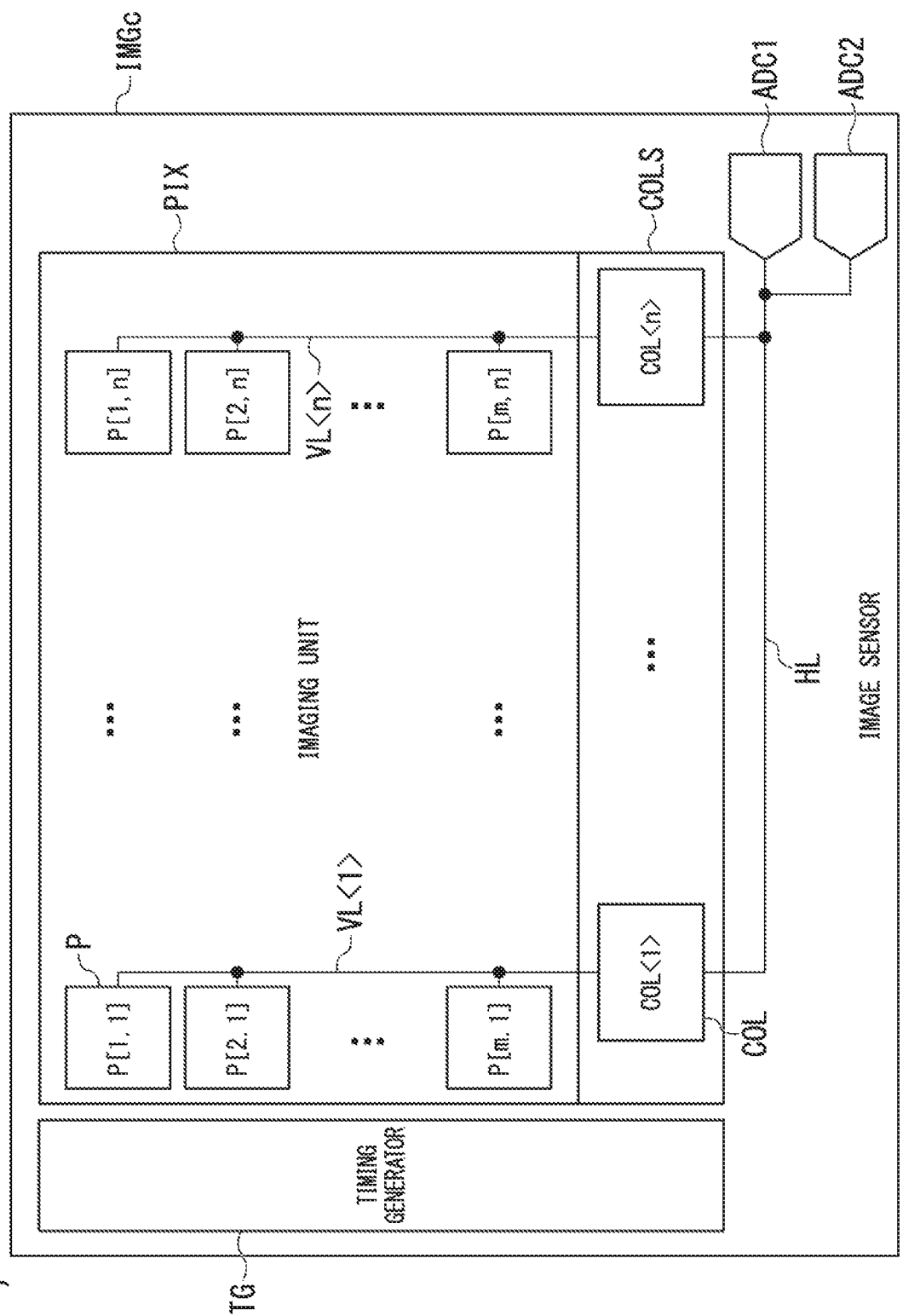
FIG. 7 is a block diagram showing the entire configuration of an image sensor according to a third modified example of the first embodiment of the present invention.

The entire configuration of an image sensor IMGc according to a third modified example of the first embodiment will be described with reference to FIG. 7. FIG. 7 shows the entire configuration of the image sensor IMGc. In the configuration shown in FIG. 7, points different from the configuration shown in FIG. 1 will be described.

The image sensor IMGc includes two AD converters ADC1 and ADC2. The AD converter ADC1 and the AD converter ADC2 are connected to a horizontal signal line HL. The configuration of each of the AD converter ADC1 and the AD converter ADC2 is the same as the configuration of the AD converter ADC shown in FIG. 2. The AD converter ADC1 performs a sampling operation in parallel with an AD conversion operation performed by the AD converter ADC2, and the AD converter ADC1 performs an AD conversion operation in parallel with a sampling operation performed by the AD converter ADC2. In the sampling operation, electric charge corresponding to an input signal input to the AD converter ADC1 or the AD converter ADC2, in other words, a video signal VSIG is sampled in a plurality of DAC capacitors C1P to C8P or a plurality of DAC capacitors C1N to C8N. The AD converter ADC1 and the AD converter ADC2 alternately perform a sampling operation and an AD conversion operation.

When the AD converter ADC1 performs an AD conversion operation, the AD converter ADC2 performs a sampling operation. Following the sampling operation, the AD converter ADC2 performs an AD conversion operation. When the AD converter ADC2 performs an AD conversion operation, the AD converter ADC1 performs a sampling operation. Following the sampling operation, the AD converter ADC1 performs an AD conversion operation. In a sampling operation (the period T1 shown in FIG. 3), electric charge corresponding to an input signal input to the AD converter ADC1 or the AD converter ADC2, in other words, a video signal VSIG is sampled in a plurality of DAC capacitors C1P to C8P or a plurality of DAC capacitors C1N to C8N. In an AD conversion operation (the period T2 to the period T11 shown in FIG. 3), AD conversions are sequentially performed on the basis of electric charge sampled in the plurality of DAC capacitors C1P to C8P or the plurality of DAC capacitors C1N to C8N by the sampling operation. In the configuration shown in FIG. 7, points other than those described above are similar to the configuration shown in FIG. 1.

In the operations described above, a sampling operation using one of the AD converter ADC1 and the AD converter ADC2 and an AD conversion operation using the other of the AD converter ADC1 and the AD converter ADC2 are performed in parallel with each other. For this reason, the image sensor IMGc can perform an AD conversion at a higher speed than the speed of a case in which one AD converter ADC performs an AD conversion as shown in FIG. 1.

Second Embodiment

Figure 8:
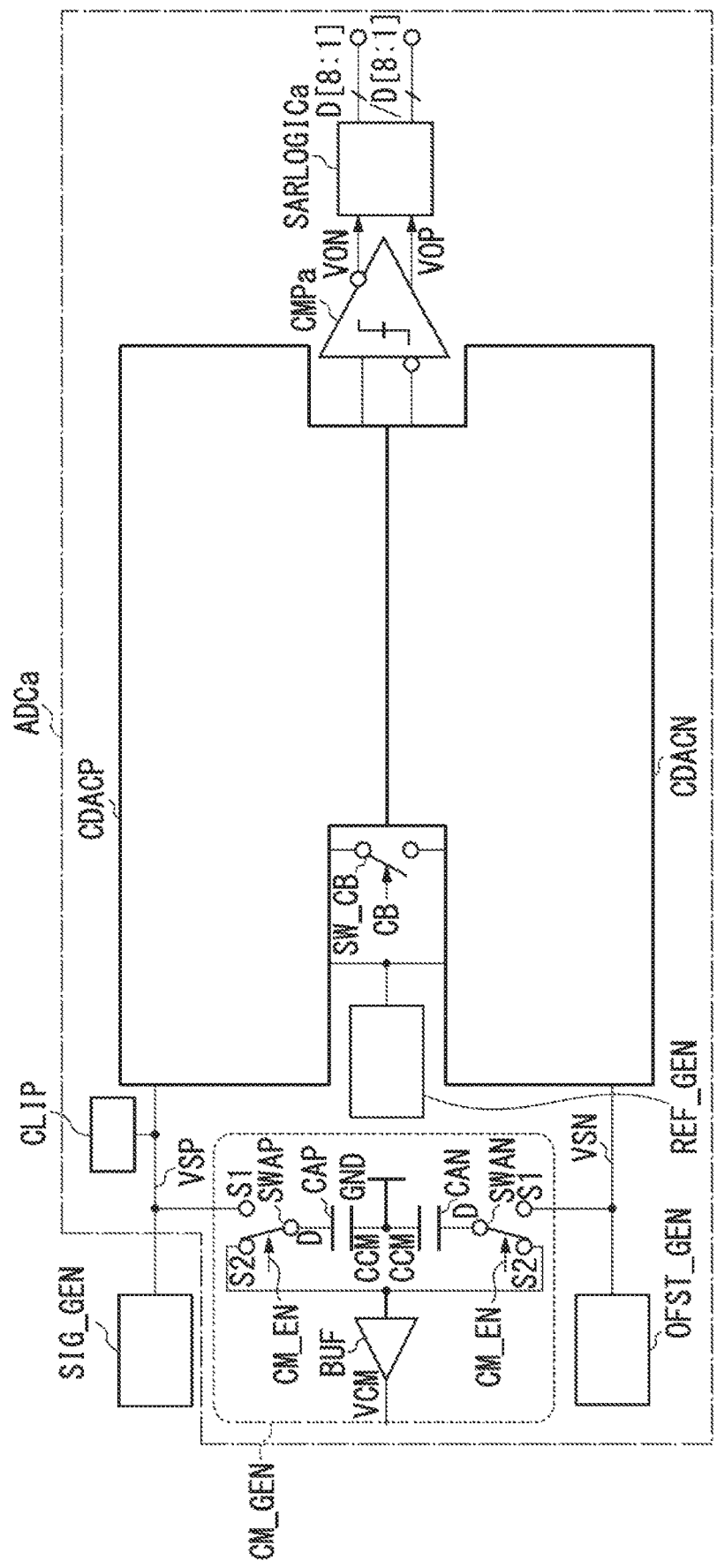
FIG. 8 is a circuit diagram showing the configuration of an AD converter according to a second embodiment of the present invention.

The configuration of an AD converter ADCa according to a second embodiment of the present invention will be described with reference to FIG. 8. FIG. 8 shows the configuration of the AD converter ADCa. In the configuration shown in FIG. 8, points different from the configuration shown in FIG. 2 will be described. In FIG. 8, for the convenience of description, internal configurations of a DAC circuit CDACP and a DAC circuit CDACN are not shown.

The AD converter ADCa includes a common mode signal generating circuit CM_GEN (reference electric potential generating circuit) and a clipping circuit CLIP in addition to the blocks constituting the AD converter ADC according to the first embodiment. The comparison circuit CMP and the control circuit SARLOGIC of the AD converter ADC according to the first embodiment are respectively changed to a comparison circuit CMPa and a control circuit SARLOGICa.

The common mode signal generating circuit CM_GEN includes a capacitor CAP, a capacitor CAN, a switch SWAP, a switch SWAN, and a buffer circuit BUF.

Each of the capacitor CAP and the capacitor CAN includes a first terminal and a second terminal. The first terminal of each of the capacitor CAP and the capacitor CAN is connected to the ground GND. The second terminal of the capacitor CAP is connected to the switch SWAP. The second terminal of the capacitor CAN is connected to the switch SWAN. The capacitance values of the capacitor CAP and the capacitor CAN are the same (CCM).

The switch SWAP includes a first terminal S1, a second terminal S2, and a third terminal D. The first terminal S1 of the switch SWAP is connected to a node VSP. The second terminal S2 of the switch SWAP is connected to the buffer circuit BUF. The third terminal D of the switch SWAP is connected to the second terminal of the capacitor CAP. The state of the switch SWAP is switched between a first state and a second state. When the switch SWAP is in the first state, the first terminal S1 of the switch SWAP and the third terminal D of the switch SWAP are electrically connected. At this time, a video signal VSIG supplied from a video signal generating circuit SIG_GEN is input to the capacitor CAP. When the switch SWAP is in the second state, the second terminal S2 of the switch SWAP and the third terminal D of the switch SWAP are electrically connected. At this time, a voltage of the video signal VSIG maintained in the capacitor CAP is output to the buffer circuit BUF. The state of the switch SWAP is controlled using a control signal CM_EN. In a case in which the control signal CM_EN is "H," the switch SWAP is in the first state. On the other hand, in a case in which the control signal CM_EN is "L," the switch SWAP is in the second state.

The switch SWAN includes a first terminal S1, a second terminal S2, and a third terminal D. The first terminal S1 of the switch SWAN is connected to a node VSN. The second terminal S2 of the switch SWAN is connected to the buffer circuit BUF. The third terminal D of the switch SWAN is connected to the second terminal of the capacitor CAN. The state of the switch SWAN is switched between a first state and a second state. When the switch SWAN is in the first state, the first terminal S1 of the switch SWAN and the third terminal D of the switch SWAN are electrically connected. At this time, an offset signal VOFST supplied from the offset signal generating circuit OFST_GEN is input to the capacitor CAN. When the switch SWAN is in the second state, the second terminal S2 of the switch SWAN and the third terminal D of the switch SWAN are electrically connected. At this time, a voltage of the offset signal VOFST maintained in the capacitor CAN is output to the buffer circuit BUF. The state of the switch SWAN is controlled using the control signal CM_EN. In a case in which the control signal CM_EN is "H," the switch SWAN is in the first state. On the other hand, in a case in which the control signal CM_EN is "L," the switch SWAN is in the second state.

The buffer circuit BUF includes an input terminal and an output terminal. An input terminal of the buffer circuit BUF is connected to the second terminal S2 of the switch SWAP and the second terminal S2 of the switch SWAN. An output terminal of the buffer circuit BUF is connected to a first terminal of a clamp switch SWCLP and a first terminal of a clamp switch SWCLN. The buffer circuit BUF outputs a signal input to the input terminal as a common mode signal VCM.

According to the configuration described above, the common mode signal generating circuit CM_GEN detects a middle electric potential and outputs the detected middle electric potential to the node VIP of the DAC circuit CDACP and the node VSN of the DAC circuit CDACN as a reference electric potential (common mode signal VCM). The middle electric potential is in the middle of the electric potential of the video signal VSIG and the electric potential of the offset signal VOFST.

The AD converter ADCa is constituted by both a low breakdown voltage transistor (first transistor) and a high breakdown voltage transistor (second transistor). Although the low breakdown voltage transistor has a maximum rated voltage lower than that of the high breakdown voltage transistor, the low breakdown voltage transistor can be finely processed. The low breakdown voltage transistor has a characteristic such that parasitic capacitance at the time of forming the transistor is lower than that of the high breakdown voltage transistor.

At least one of the comparison circuit CMPa and the control circuit SARLOGICa includes at least one first transistor. Only one of the comparison circuit CMPa and the control circuit SARLOGICa may include at least one first transistor. The comparison circuit CMPa and the control circuit SARLOGICa may include at least one first transistor. At least one of the DAC circuit CDACP and the DAC circuit includes at least one second transistor. Only one of the DAC circuit CDACP and the DAC circuit may include at least one second transistor. The DAC circuit CDACP and the DAC circuit may include at least one second transistor. The breakdown voltage of the first transistor is lower than the breakdown voltage of the second transistor. The AD converter ADC includes a clipping circuit CLIP. The clipping circuit CLIP is connected to at least one of the node VSP and the node VSN and controls voltages input to the DAC circuit CDACP and the DAC circuit CDACN such that the voltages are within the range of the rated voltage of the first transistor.

For example, in the DAC circuit CDACP, the switch SW_SMPLP is the second transistor. For example, in the DAC circuit CDACN, the switch SW_SMPLN is the second transistor.

The clipping circuit CLIP is a protection circuit used for preventing input of an excessively high voltage or an excessively low voltage to the DAC circuit CDACP and the DAC circuit CDACN. The excessively high voltage is a voltage that is the maximum rated voltage of the first transistor or more. The excessively low voltage is a voltage that is the minimum rated voltage of the first transistor or less. In a case in which an excessively high voltage or an excessively low voltage is input from the video signal generating circuit SIG_GEN, the clipping circuit CLIP fixes the input voltage to a predetermined clipping voltage. Accordingly, an input of an excessively high voltage or an excessively low voltage to a low breakdown voltage transistor that is included in at least one of the comparison circuit CMPa and the control circuit SARLOGICa can be prevented. In accordance with the function of the clipping circuit CLIP, the voltage VIP of the node VIP is controlled such that it is in a range represented by Equation (13), and the voltage VIN of the node VIN is controlled such that it is in a range represented by Equation (14). In Equations (13) and (14). VSS_MIN represents a lowest rated voltage that can be input to a transistor manufactured in a low breakdown voltage process. In addition, VDD_MAX represents a highest rated voltage that can be input to a transistor that is manufactured in a low breakdown voltage process.

$$VSS\_MIN < VIP < VDD\_MAX \quad (13)$$

$$VSS\_MIN < VIN < VDD\_MAX \quad (14)$$

In the configuration shown in FIG. 8, points other than those described above are similar to the configuration shown in FIG. 2.

Figure 9:
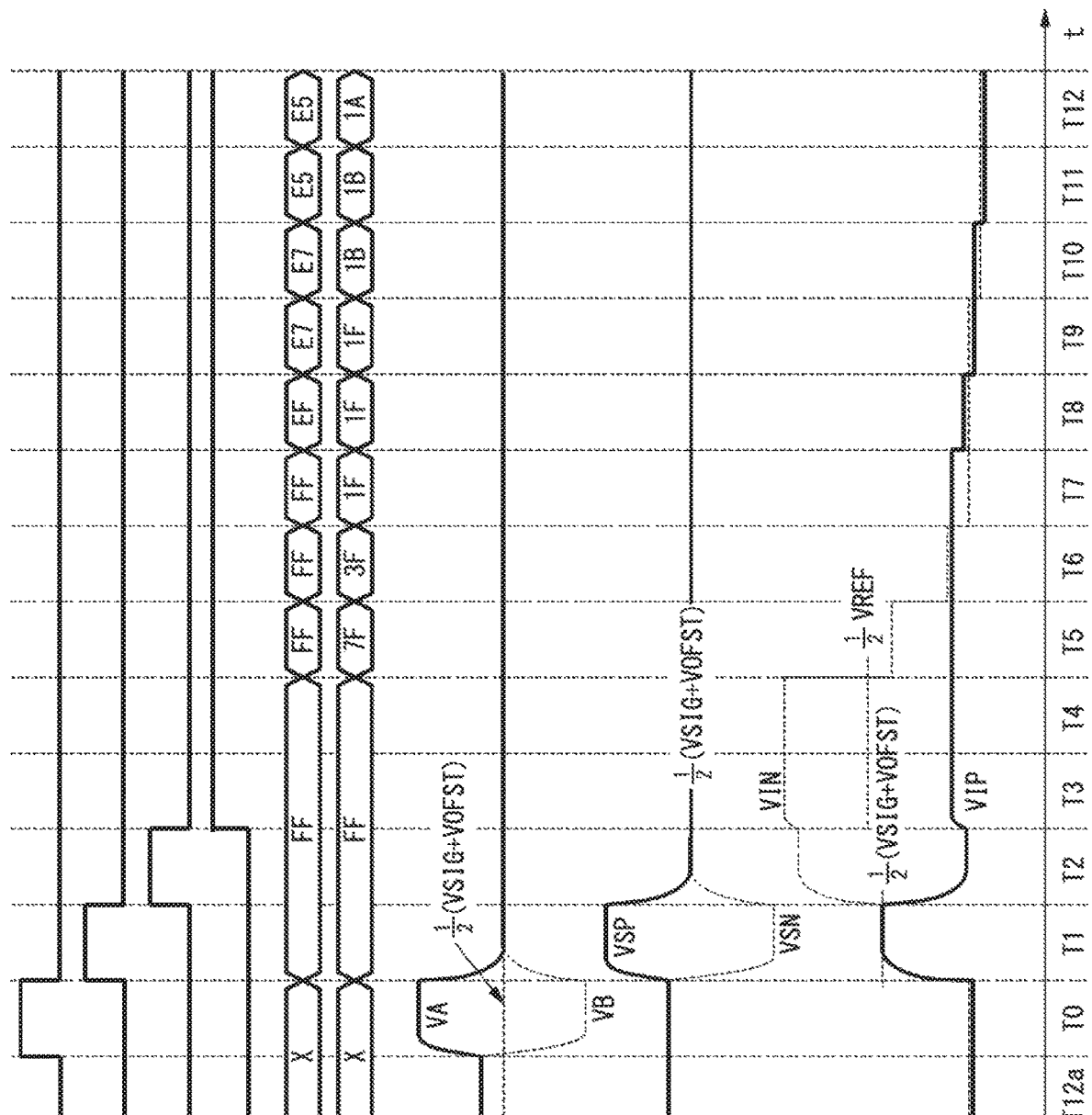
FIG. 9 is a timing diagram showing an operation of an AD converter according to the second embodiment of the present invention.

The operation of the AD converter ADCa will be described with reference to FIG. 9. FIG. 9 shows signals relating to the operation of the AD converter ADCa. In FIG. 9, the control signal CM_EN, the control signal SMPLP, the control signal SMPLN, the control signal CLP, the control signal CB, and the control signal REF_EN are shown. In FIG. 9, a digital signal D[8:1] and a digital signal /D[8:1] are represented in hexadecimal digits. In FIG. 9, the electric potentials of a node VA, a node VB, a node VSP, a node VSN, a node VIP, and a node VIN are shown. The node VA is a node to which the second terminal of the capacitor CAP and the third terminal D of the switch SWAP are connected. The node VB is a node to which the second terminal of the capacitor CAN and the third terminal D of the switch SWAN are connected. In FIG. 9, the horizontal axis represents time, and the vertical axis represents a signal level.

In FIG. 9, operations in periods T0 to T12 and a period T12a are shown. The operations in the periods T0 to T12 constitute a basic sequence. The AD converter ADCa repeats the basic sequence for each AD conversion operation of a sampled signal. The period T12a is a period in which an AD conversion of the previous sample ends. The operation in the period T12a is equivalent to the operation in the period T12.

The period T0 is a period for detecting a common mode input voltage of a signal input from the outside. In the period T0, when the control signal CM_EN becomes "H," the first terminal S1 and the third terminal D of each of the switch SWAP and the switch SWAN are connected. Accordingly, the video signal VSIG and the offset signal VOFST are sampled. In the period T0, electric charge based on the video signal VSIG is maintained in the capacitor CAP, and electric charge based on the offset signal VOFST is maintained in the capacitor CAN. The electric charge QA maintained in the capacitor CAP is represented using Equation (15). The electric charge QB maintained in the capacitor CAN is represented using Equation (16).

$$QA = CCM \cdot VSIG \quad (15)$$

$$QB = CCM \cdot VOFST \quad (16)$$

The period T1 is a period for sampling a signal input to the AD converter ADCa. In the period T1, when the control signal CM_EN becomes "L," the second terminal S2 and the third terminal D of each of the switch SWAP and the switch SWAN are connected. For this reason, the capacitor CAP and the CAN are connected to the buffer circuit BUF. Since the electric charge QA and the electric charge QB are conserved, a voltage of an input terminal of the buffer circuit BUF is represented using Equation (17).

$$V = (QA + QB)/(2 \cdot CCM) = (VSIG + VOFST)/2 \quad (17)$$

Accordingly, the common mode signal generating circuit CM_GEN outputs a middle electric potential between the electric potential of the video signal VSIG and the electric potential of the offset signal VOFST as a common mode signal VCM. The electric potential VCM of the common mode signal VCM is represented using Equation (18).

$$VCM = (VSIG + VOFST)/2 \quad (18)$$

In the period T1, the first terminals S1 and the third terminals D of the switches SW1P to SW8P and the switches SW1N to SW8N are connected. In the period T1, the switch SW_SMPLP, the switch SW_SMPLN, the clamp switch SWCLP, and the clamp switch SWCLN are on. This operation is similar to the operation described in the first embodiment.

In the period T1, electric charge based on the video signal VSIG and the common mode signal VCM is maintained in the DAC capacitors C1P to C8P, and electric charge based on the offset signal VOFST and the common mode signal VCM is maintained in the DAC capacitors C1N to C8N. The electric charge QP maintained in the DAC capacitors C1P to C8P is represented using Equation (7). The electric charge QN maintained in the DAC capacitors C1N to C8N is represented using Equation (8). Equations (7) and (8) are shown again.

$$QP=C(VSIG-VCM) \quad (7)$$

$$QN=C(VOFST-VCM) \quad (8)$$

The period T2 is a period for converting a single end signal input to the AD converter ADCa into a full differential signal. This conversion is realized when the crowbar switch SW_CB is turned on after the switch SW_SMPLP, the switch SW_SMPLN, the clamp switch SWCLP, and the clamp switch SWCLN are turned off. This operation is similar to the operation described in the first embodiment. The electric potential of the node VIP is represented using Equation (9), and the electric potential of the node VIN is represented using Equation (10). Equations (9) and (10) are shown again.

$$VIP=VCM-(½)(VSIG-VOFST) \quad (9)$$

$$VIN=VCM+(½)(VSIG-VOFST) \quad (10)$$

In the period T3, the crowbar switch SW_CB is turned off, and the reference signal input switch SW_REFP and the reference signal input switch SW_REFN are turned on. This operation is similar to the operation described in the first embodiment. The electric potential of the node VIP is represented using Equation (11), and the electric potential of the node VIN is represented using Equation (12). Equations (11) and (12) are shown again.

$$VIP=-VSIG+VCM+(½)·VREF \quad (11)$$

$$VIN=-VOFST+VCM+(½)·VREF \quad (12)$$

By substituting Equation (18) into Equations (11) and (12). Equations (11) and (12) respectively form Equations (19) and (20). As represented in Equations (19) and (20), the video signal VSIG is converted into a full-differential signal having a reference voltage of (½)·VREF as its center.

$$VIP=-(½)(VSIG-VOFST)+(½)·VREF \quad (19)$$

$$VIN=+(½)(VSIG-VOFST)+(½)·VREF \quad (20)$$

In the AD converter ADC according to the first embodiment, in a case in which the electric potential of the common mode signal VCM is constant, a common mode input voltage (a middle voltage of the node VIP and the node VIN) of a signal input to the comparator CMP, as represented in Equations (11) and (12), varies in accordance with the magnitudes of the video signal VSIG and the offset signal VOFST that are input. In other words, the middle voltage of the node VIP and the node VIN driven using Equations (11) and (12) is represented using Equation (21).

$$(VIP+VIN)/2=[\{-VSIG+VCM+(½)·VREF\}+\{-VOFST+VCM+(½)·VREF\}]/2=(-½)(VSIG+VOFST)+VCM+(½)·VREF \quad (21)$$

In a case in which VCM and VREF are constant, the middle voltage (VIP+VIN)/2 varies by (−½)(VSIG+VOFST). An example is shown in which, in the period T3 shown in FIG. 3, by inputting the reference signal VREF to the AD converter ADC, the electric potentials of the node VIP and the node VIN are upwardly shifted. In a case in which the electric potentials of the node VIP and the node VIN vary, the range of the input voltage that can be processed by the comparison circuit CMP needs to be set in consideration of variations in the common mode signal VCM. In other words, the range of the input voltage that can be processed by the comparison circuit CMP needs to be set in a wider range. For this reason, the power source voltage of the comparison circuit CMP becomes higher.

In the AD converter ADCa according to the second embodiment, a common mode input voltage of signals input to the comparator CMP (a middle voltage of the node VIP and node VIN), as represented by Equations (19) and (20), is constant at (½)·VREF regardless of the electric potentials of the video signal VSIG and the offset signal VOFST. From Equations (19) and (20), (VIP+VIN)/2 is (½)·VREF. Accordingly the range of the input voltage for which the comparison circuit CMPa according to the second embodiment can perform signal processing can be set as being narrower than the range of the input voltage for which the comparison circuit CMP according to the first embodiment can perform signal processing. In other words, the power source voltage of the comparison circuit CMPa can be set to be lower, and accordingly, the power consumption of the comparison circuit CMPa is decreased.

The period T4 to the period T12 correspond to a comparison period from the MSB to the LSB of the AD converter. The operation of the AD converter ADCa in such periods is similar to the operation of the AD converter ADC according to the first embodiment, and thus, description thereof will not be presented here.

The AD converter ADCa need not include the clipping circuit CLIP. In a case in which the AD converter ADC shown in FIG. 2 is constituted by a low breakdown voltage transistor and a high breakdown voltage transistor, the AD converter ADC may include the clipping circuit CLIP.

The AD converter ADCa may be applied to the image sensor IMG (FIG. 1), the image sensor IMGa (FIG. 5), and the image sensor IMGb (FIG. 6) instead of the AD converter ADC. The AD converter ADCa can be applied to the image sensor IMGc (FIG. 7) instead of the AD converter ADC1 and the AD converter ADC2.

In the AD converter ADCa according to the second embodiment, by using a middle electric potential of the electric potential of the video signal VSIG and the electric potential of the offset signal VOFST as a common mode signal VCM, the video signal VSIG and the offset signal VOFST input to the DAC circuit CDACP and the DAC circuit CDACN are sampled. For this reason, a middle voltage of the full-differential signal (the common mode input voltage of the comparator CMP) acquired when the crowbar switch SW_CB is on is constant and is the value of (½)·VREF regardless of the electric potentials of the video signal VSIG and the offset signal VOFST. As a result, the AD converter ADCa operating at a low voltage can process a video signal VSIG having a large amplitude.

The power consumption P of a digital circuit is represented using Equation (21). In Equation (21), f is an operation frequency of the digital circuit. $C_P$ is a parasitic capacitance and load capacitance of the digital circuit. $V_{DD}$ is a power source voltage of the digital circuit. As represented by Equation (21), the power consumption P of a digital circuit is proportional to the square of the power source voltage $V_{DD}$ of the digital circuit. For this reason, the AD converter ADCa that can process a video signal VSIG having a large amplitude with a low voltage can be operated with low power consumption.

$$P \propto f \cdot C_P \cdot V_{DD}^2 \qquad (21)$$

In the AD converter ADCa according to the second embodiment, in accordance with the clipping function of the clipping circuit CLIP, damage to the low breakdown voltage transistor according to an excessively high voltage or an excessively low voltage output from a circuit constituted by a high breakdown voltage transistor can be prevented. A circuit constituted by a low breakdown voltage transistor can operate with a low voltage. A circuit constituted by a low breakdown voltage transistor is formed through fine processing, and accordingly, the parasitic capacitance $C_P$ of the circuit is low. For this reason, the power consumption of the circuit is decreased. Therefore, the power consumption of the AD converter ADCa is decreased.

Modified Example of Second Embodiment

Figure 10:
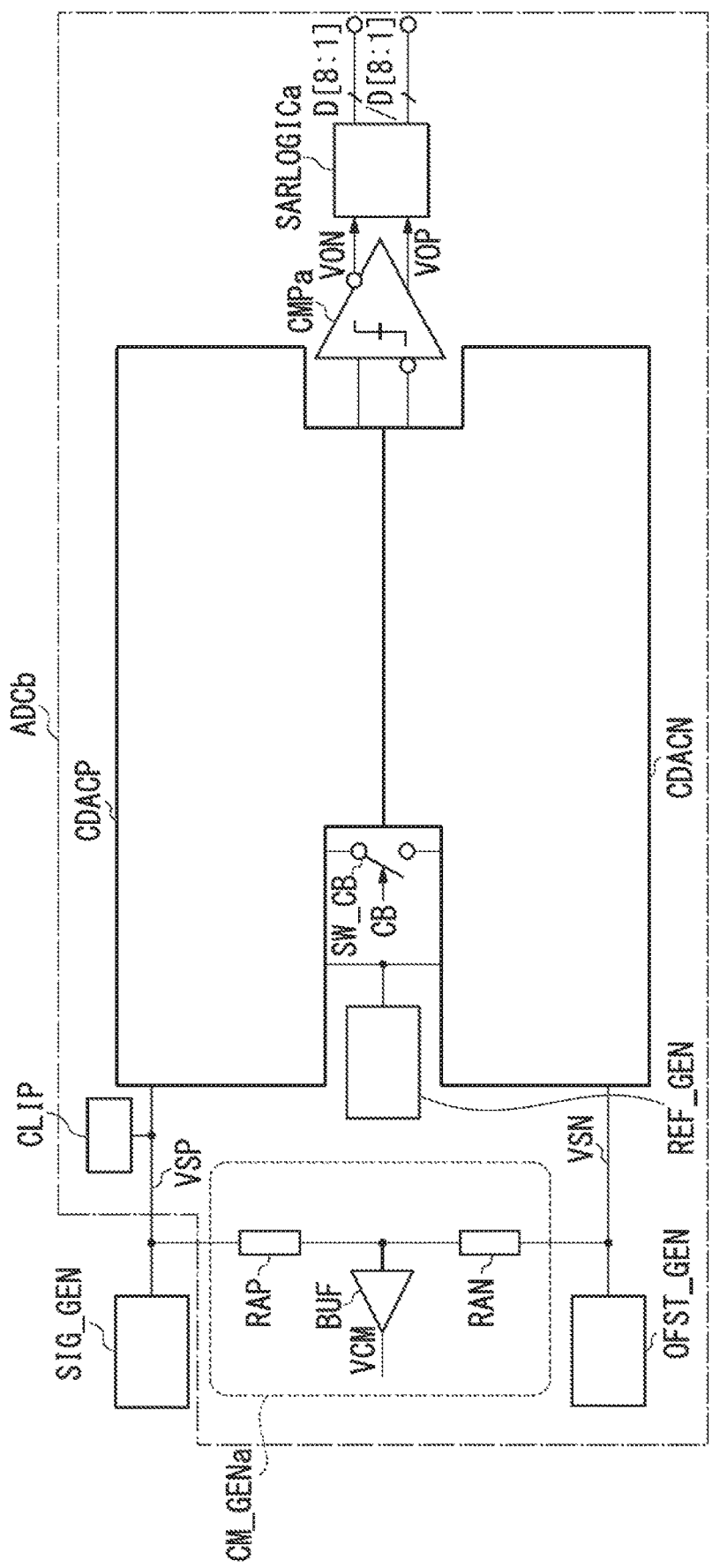
FIG. 10 is a circuit diagram showing the configuration of an AD converter according to a modified example of the second embodiment of the present invention.

The entire configuration of an AD converter ADCb according to a modified example of the second embodiment will be described with reference to FIG. 10. FIG. 10 shows the configuration of the AD converter ADCb. In the configuration shown in FIG. 10, points different from the configuration shown in FIG. 8 will be described. In FIG. 10, for the convenience of description, the internal configurations of a DAC circuit CDACP and a DAC circuit CDACN are not shown.

In the AD converter ADCb, the common mode signal generating circuit CM_GEN of the AD converter ADCa is replaced with a common mode signal generating circuit CM_GENa. The common mode signal generating circuit CM_GENa includes a resistor RAP, a resistor RAN, and a buffer circuit BUF.

Each of the resistor RAP and the resistor RAN includes a first terminal and a second terminal. The first terminal of the resistor RAP is connected to a node VSP. The first terminal of the resistor RAN is connected to a node VSN. The second terminal of each of the resistor RAP and the resistor RAN is connected to an input terminal of the buffer circuit BUF. The resistance values of the resistor RAP and the resistor RAN are the same. The buffer circuit BUF is the same as the buffer circuit BUF of the common mode signal generating circuit CM_GEN shown in FIG. 8.

By employing the configuration described above, the common mode signal generating circuit CM_GENa detects a middle electric potential and outputs the detected middle electric potential to the node VIP of the DAC circuit CDACP and the node VSN of the DAC circuit CDACN as a reference electric potential (common mode signal VCM). The middle electric potential is in the middle of the electric potential of the video signal VSIG and the electric potential of the offset signal VOFST.

In the configuration shown in FIG. 10, points other than those described above are similar to the configuration shown in FIG. 8.

When a video signal VSIG supplied from the video signal generating circuit SIG_GEN is input to the node VSP, and an offset signal VOFST supplied from the offset signal generating circuit OFST_GEN is input to the node VSN, the common mode signal generating circuit CM_GENa outputs a common mode signal VCM. In order for the common mode signal generating circuit CM_GENa to generate a common mode signal VCM, the operation of the period T0 shown in FIG. 9 is not necessary. For this reason, the AD converter ADCb can perform an AD conversion in accordance with a sequence acquired by eliminating the part of the period T0 from the timing diagram shown in FIG. 9.

The AD converter ADCb need not include the clipping circuit CLIP. The AD converter ADCb can be applied to the image sensor IMG (FIG. 1), the image sensor IMGa (FIG. 5), and the image sensor IMGb (FIG. 6) instead of the AD converter ADC. The AD converter ADCb can be applied to the image sensor IMGc (FIG. 7) instead of the AD converter ADC1 and the AD converter ADC2.

While preferred embodiments of the invention have been described and shown above, it should be understood that these are exemplars of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An AD converter comprising:
    a first DAC circuit including a plurality of first capacitors of which capacitance values are weighted;
    a second DAC circuit including a plurality of second capacitors of which capacitance values are weighted;
    a comparison circuit connected to a first output node of the first DAC circuit and a second output node of the second DAC circuit and configured to compare an electric potential of the first output node with an electric potential of the second output node;
    a control circuit configured to control the first DAC circuit and the second DAC circuit in accordance with a result of the comparison acquired by the comparison circuit;
    a control switch configured to control turning on and off of connection between a first input node of the first DAC circuit and a second input node of the second DAC circuit; and
    a reference electric potential generating circuit,
    wherein a video signal generating circuit is connected to one of the first input node of the first DAC circuit and the second input node of the second DAC circuit, and is configured to generate a video signal,
    an offset signal generating circuit is connected to a node other than the node to which the video signal generating circuit is connected out of the first input node and the second input node, and is configured to generate an offset signal, and
    the reference electric potential generating circuit detects a middle electric potential and outputs the detected middle electric potential to the first output node and the second output node as a reference electric potential, the middle electric potential being in the middle of an electric potential of the video signal and an electric potential of the offset signal.

2. The AD converter according to claim 1, wherein the electric potential of the offset signal is changeable in accordance with a magnitude of the electric potential of the video signal.

3. The AD converter according to claim 1,
    wherein a reference signal generating circuit is connected to the first input node and the second input node, and is configured to generate a reference signal, and an electric potential of the reference signal is changeable in accordance with the magnitude of the electric potential of the video signal.

4. An image sensor comprising:
the AD converter according to claim 1; and
a video signal generating circuit configured to generate a video signal,
wherein the video signal generating circuit includes
a plurality of pixels disposed in a matrix pattern and
a plurality of column circuits, each column circuit included in the plurality of column circuits being disposed for each column of the plurality of pixels, and
one of the AD converter is disposed in correspondence with each column circuit included in the plurality of column circuits.

5. An image sensor comprising:
the AD converter according to claim 1; and
a video signal generating circuit configured to generate a video signal,
wherein the video signal generating circuit includes
a plurality of pixels disposed in a matrix pattern and
a plurality of column circuits, each column circuit included in the plurality of column circuits being disposed for each column of the plurality of pixels, and
one of the AD converter is disposed in correspondence with each subgroup included in a plurality of subgroups, or one of the AD converter is disposed in correspondence with the plurality of column circuits, and each of the subgroups includes two or more column circuits among the plurality of column circuits.

6. An AD converter comprising:
a first DAC circuit including a plurality of first capacitors of which capacitance values are weighted;
a second DAC circuit including a plurality of second capacitors of which capacitance values are weighted;
a comparison circuit connected to a first output node of the first DAC circuit and a second output node of the second DAC circuit and configured to compare an electric potential of the first output node with an electric potential of the second output node;
a control circuit configured to control the first DAC circuit and the second DAC circuit in accordance with a result of the comparison acquired by the comparison circuit;
a control switch configured to control turning on and off of connection between a first input node of the first DAC circuit and a second input node of the second DAC circuit; and
a clipping circuit,
wherein at least one of the comparison circuit and the control circuit includes at least one first transistor,
at least one of the first DAC circuit and the second DAC circuit includes at least one second transistor,
a breakdown voltage of the first transistor is lower than a breakdown voltage of the second transistor, and
the clipping circuit is connected to at least one of the first input node and the second input node and controls voltages input to the first DAC circuit and the second DAC circuit such that the voltages are within a range of a rated voltage of the first transistor.

* * * * *